United States Patent
Xu et al.

(10) Patent No.: US 12,550,361 B2
(45) Date of Patent: Feb. 10, 2026

(54) SEMICONDUCTOR DEVICE

(71) Applicant: SAMSUNG ELECTRONICS CO., LTD., Suwon-si (KR)

(72) Inventors: Yang Xu, Seoul (KR); Nam Kyu Cho, Yongin-si (KR); Seok Hoon Kim, Suwon-si (KR); Yong Seung Kim, Seongnak-si (KR); Pan Kwi Park, Incheon (KR); Dong Suk Shin, Suwon-si (KR); Sang Gil Lee, Ansan-si (KR); Si Hyung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 727 days.

(21) Appl. No.: 17/831,513

(22) Filed: Jun. 3, 2022

(65) Prior Publication Data

US 2023/0145260 A1  May 11, 2023

(30) Foreign Application Priority Data

Nov. 5, 2021  (KR) ........................ 10-2021-0151001

(51) Int. Cl.
*H10D 30/62* (2025.01)
*H10D 62/10* (2025.01)

(52) U.S. Cl.
CPC ..... *H10D 30/6211* (2025.01); *H10D 30/6219* (2025.01); *H10D 62/115* (2025.01)

(58) Field of Classification Search
CPC ........... H10D 30/6211; H10D 30/6219; H10D 62/115
See application file for complete search history.

(56) References Cited

U.S. PATENT DOCUMENTS 9,418,897 B1 *  8/2016  Ching .................. H10D 30/024
9,425,319 B2     8/2016  Cai et al.
(Continued)

FOREIGN PATENT DOCUMENTS

KR    10-2017-0062618 A    6/2017
KR    10-2017-0083838 A    7/2017
KR    10-2019-0023882      3/2019

OTHER PUBLICATIONS

EP Partial Search Report issued in corresponding application No. EP 22 184 956.5 on Jan. 30, 2023.
(Continued)

*Primary Examiner* — Nathan W Ha
(74) *Attorney, Agent, or Firm* — MORGAN, LEWIS & BOCKIUS LLP

(57) ABSTRACT

A semiconductor device including: a plurality of fin-shaped patterns spaced apart from each other in a first direction and extending in a second direction on a substrate; a field insulating layer covering sidewalls of the plurality of fin-shaped patterns and disposed between the fin-shaped patterns; a source/drain pattern connected to the plurality of fin-shaped patterns on the field insulating layer, the source/drain pattern including bottom surfaces respectively connected to the fin-shaped patterns, and at least one connection surface connecting the bottom surfaces to each other, and a sealing insulating pattern extending along the connection surface of the source/drain pattern and an upper surface of the field insulating layer, wherein the source/drain pattern includes a silicon-germanium pattern doped with a p-type impurity.

20 Claims, 31 Drawing Sheets

(56) References Cited

U.S. PATENT DOCUMENTS

| | | | |
|---|---|---|---|
| 9,728,601 B2* | 8/2017 | Kim | H10D 84/834 |
| 10,026,809 B1* | 7/2018 | Seong | H10D 84/0158 |
| 10,651,091 B2* | 5/2020 | Wang | H10D 30/791 |
| 10,679,896 B2* | 6/2020 | Hsieh | H01L 21/76895 |
| 10,707,328 B2* | 7/2020 | Sung | H01L 21/02532 |
| 10,727,348 B2 | 7/2020 | Kim et al. | |
| 10,854,602 B2* | 12/2020 | Li | H10D 84/0151 |
| 10,879,128 B2 | 12/2020 | Kwok et al. | |
| 2014/0042502 A1 | 2/2014 | Xie et al. | |
| 2014/0061817 A1 | 3/2014 | Gan et al. | |
| 2014/0369115 A1 | 12/2014 | Kim et al. | |
| 2016/0013104 A1 | 1/2016 | Hung et al. | |
| 2017/0154991 A1* | 6/2017 | Ko | H10D 30/024 |
| 2017/0200718 A1* | 7/2017 | Choi | H10D 84/0184 |
| 2021/0118887 A1 | 4/2021 | Kuo | |
| 2021/0193534 A1* | 6/2021 | Chen | H10D 62/151 |
| 2021/0226033 A1* | 7/2021 | Huang | H10D 30/024 |

OTHER PUBLICATIONS

Notice of Allowance dated Oct. 31, 2025 issued in the corresponding Korean Patent Application No. 10-2021-0151001. (Note: U.S. Pat. No. 20170200718 A1, U.S. Pat. No. 20170154991 A1, and U.S. Pat. No. 9418897 B1 already submitted.).

* cited by examiner

SEMICONDUCTOR DEVICE

CROSS-REFERENCE TO RELATED APPLICATION

This application claims priority under 35 U.S.C. § 119 to Korean Patent Application No. 10-2021-0151001 filed on Nov. 5, 2021 in the Korean Intellectual Property Office, the disclosure of which is incorporated by reference herein in its entirety.

1. TECHNICAL FIELD

The present disclosure relates to a semiconductor device.

2. DESCRIPTION OF THE RELATED ART

Multi-gate transistors are one of several strategies being developed to increase the density of semiconductor devices. A multi-gate transistor is configured to include a fin- or nanowire-shaped multi-channel active pattern (or silicon body) formed on a substrate and a gate formed on the surface of the multi-channel active pattern.

Since the multi-gate transistor uses a three-dimensional (3D) channel, which consists of the two vertical surfaces and the top surface of the fin, scaling of the multi-gate transistor can be easily achieved. Further, current control capability can be improved without increasing the gate length of the multi-gate transistor. In addition, a short channel effect (SCE) in which the potential of a channel region is affected by a drain voltage can be effectively suppressed.

As a pitch (size) of the semiconductor device decreases, there is a need to decrease capacitance and secure electrical stability between contacts in the semiconductor device.

SUMMARY

Embodiments of the present disclosure provide a semiconductor device capable of improving element performance and reliability.

According to an embodiment of the present disclosure, there is provided a semiconductor device including: a plurality of fin-shaped patterns spaced apart from each other in a first direction and extending in a second direction on a substrate; a field insulating layer covering sidewalls of the plurality of fin-shaped patterns and disposed between the fin-shaped patterns; a source/drain pattern connected to the plurality of fin-shaped patterns on the field insulating layer, the source/drain pattern including bottom surfaces respectively connected to the fin-shaped patterns, and at least one connection surface connecting the bottom surfaces to each other; and a sealing insulating pattern extending along the connection surface of the source/drain pattern and an upper surface of the field insulating layer, wherein the source/drain pattern includes a silicon-germanium pattern doped with a p-type impurity.

According to an embodiment of the present disclosure, there is provided a semiconductor device including: a plurality of fin-shaped patterns extending in a first direction on a substrate; a field insulating layer covering sidewalls of the plurality of fin-shaped patterns and disposed between the fin-shaped patterns; a plurality of gate structures extending in a second direction on the field insulating layer, each of the gate structures including a gate spacer; a source/drain pattern in contact with the gate spacer between the gate structures adjacent to each other in the first direction and connected to the plurality of fin-shaped patterns, the source/drain pattern including bottom surfaces respectively connected to the fin-shaped patterns, and at least one connection surface connecting the bottom surfaces to each other; and a sealing insulating pattern extending along an upper surface of the field insulating layer and a sidewall of the gate structure, wherein the source/drain pattern includes first portions and second portions, the second portion of the source/drain pattern being disposed between the first portions of the source/drain pattern, in the first portion of the source/drain pattern, the source/drain pattern has a first width in the first direction, and in the second portion of the source/drain pattern, a width of the source/drain pattern in the first direction decreases from the first width to a second width and then increases to the first width.

According to an embodiment of the present disclosure, there is provided a semiconductor device including: a plurality of first fin-shaped patterns disposed in a first region of a substrate and spaced apart from each other in a first direction; a plurality of second fin-shaped patterns disposed in a second region of the substrate and spaced apart from each other in a second direction; a first field insulating layer covering sidewalls of the plurality of first fin-shaped patterns and disposed between the first fin-shaped patterns; a second field insulating layer covering sidewalls of the plurality of second fin-shaped patterns and disposed between the second fin-shaped patterns; a first source/drain pattern connected to the plurality of first fin-shaped patterns on the first field insulating layer, the first source/drain pattern including first bottom surfaces respectively connected to the first fin-shaped patterns, at least one first connection surface connecting the first bottom surfaces to each other, and a first outer sidewall extending from the first bottom surface; a second source/drain pattern connected to the plurality of second fin-shaped patterns on the second field insulating layer, the second source/drain pattern including second bottom surfaces respectively connected to the second fin-shaped patterns, at least one second connection surface connecting the second bottom surfaces to each other, and a second outer sidewall extending from the second bottom surface; a first sealing insulating pattern extending along the first connection surface of the first source/drain pattern, an upper surface of the first field insulating layer, and the first outer sidewall of the first source/drain pattern; and a second sealing insulating pattern extending along the second outer sidewall of the second source/drain pattern, wherein the second sealing insulating pattern is not disposed on the second connection surface of the second source/drain pattern and an upper surface of the second field insulating layer.

BRIEF DESCRIPTION OF THE DRAWINGS

The above and other features of the present disclosure will become more apparent by describing in detail example embodiments thereof with reference to the attached drawings, in which.

DETAILED DESCRIPTION OF THE EMBODIMENTS

Figure 1:
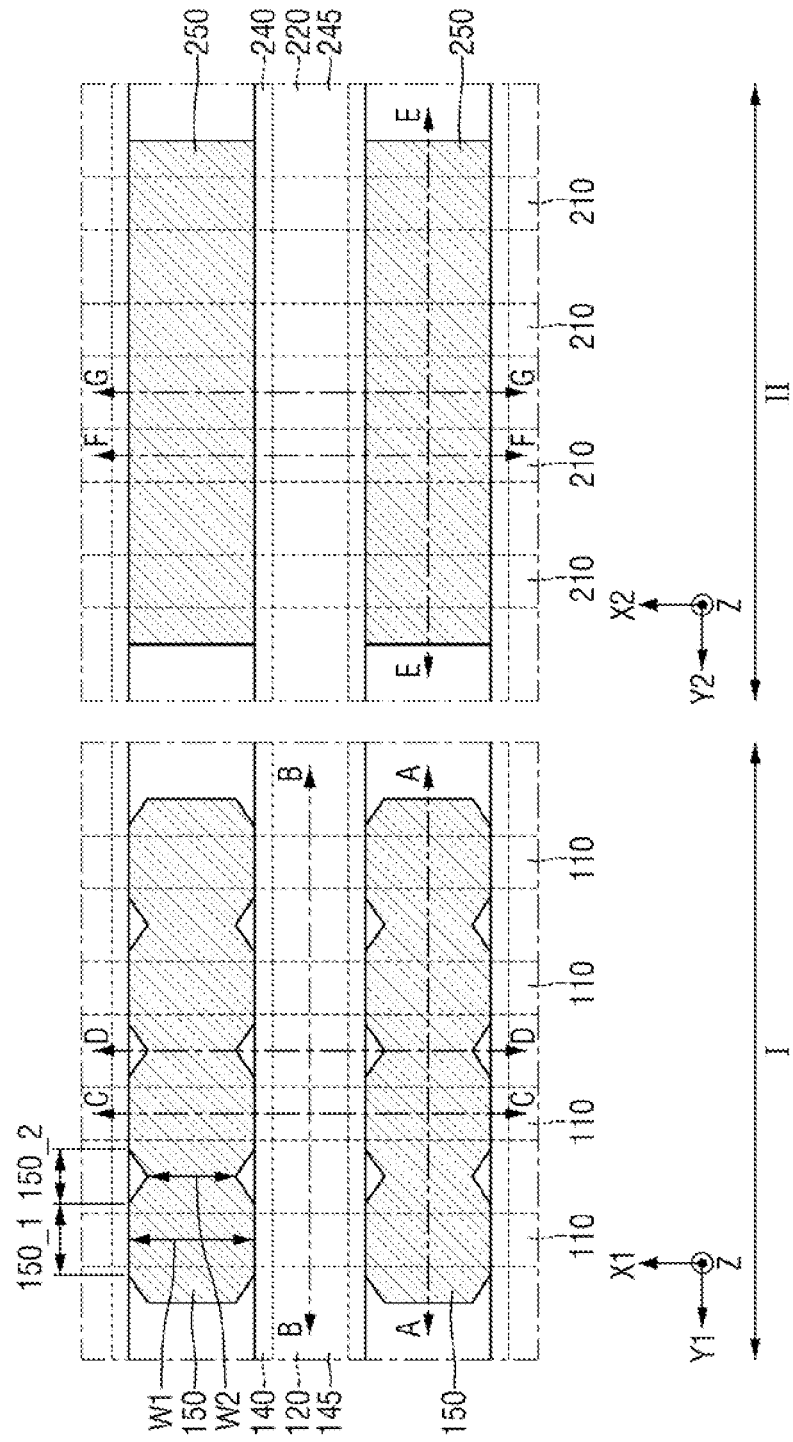
FIG. 1 is a plan view illustrating a semiconductor device according to some embodiments of the present disclosure.

In the drawings of the semiconductor device according to some embodiments of the present disclosure, a fin-shaped field effect transistor (FinFET) including a channel region of a fin-shaped pattern, a transistor including a nanowire or a nanosheet, and a multi-bridge channel field effect transistor (MBCFET™) are illustrated. It is to be understood, however, that the present disclosure is not limited to the examples shown in the drawings. For example, the semiconductor device according to some embodiments of the present disclosure may include a tunneling field effect transistor (TFET) or a three-dimensional (3D) transistor. Further, the semiconductor device according to some embodiments of the present disclosure may include a planar transistor. In addition, the present disclosure can be applied to transistors based on two-dimensional materials (2D material based FETs) and heterostructures thereof.

Further, the semiconductor device according to some embodiments of the present disclosure may include a bipolar junction transistor, a lateral double diffusion metal-oxide semiconductor (MOS) (LDMOS) transistor, or the like.

A semiconductor device according to some embodiments of the present disclosure will be described with reference to FIGS. 1 to 9.

Figure 2:
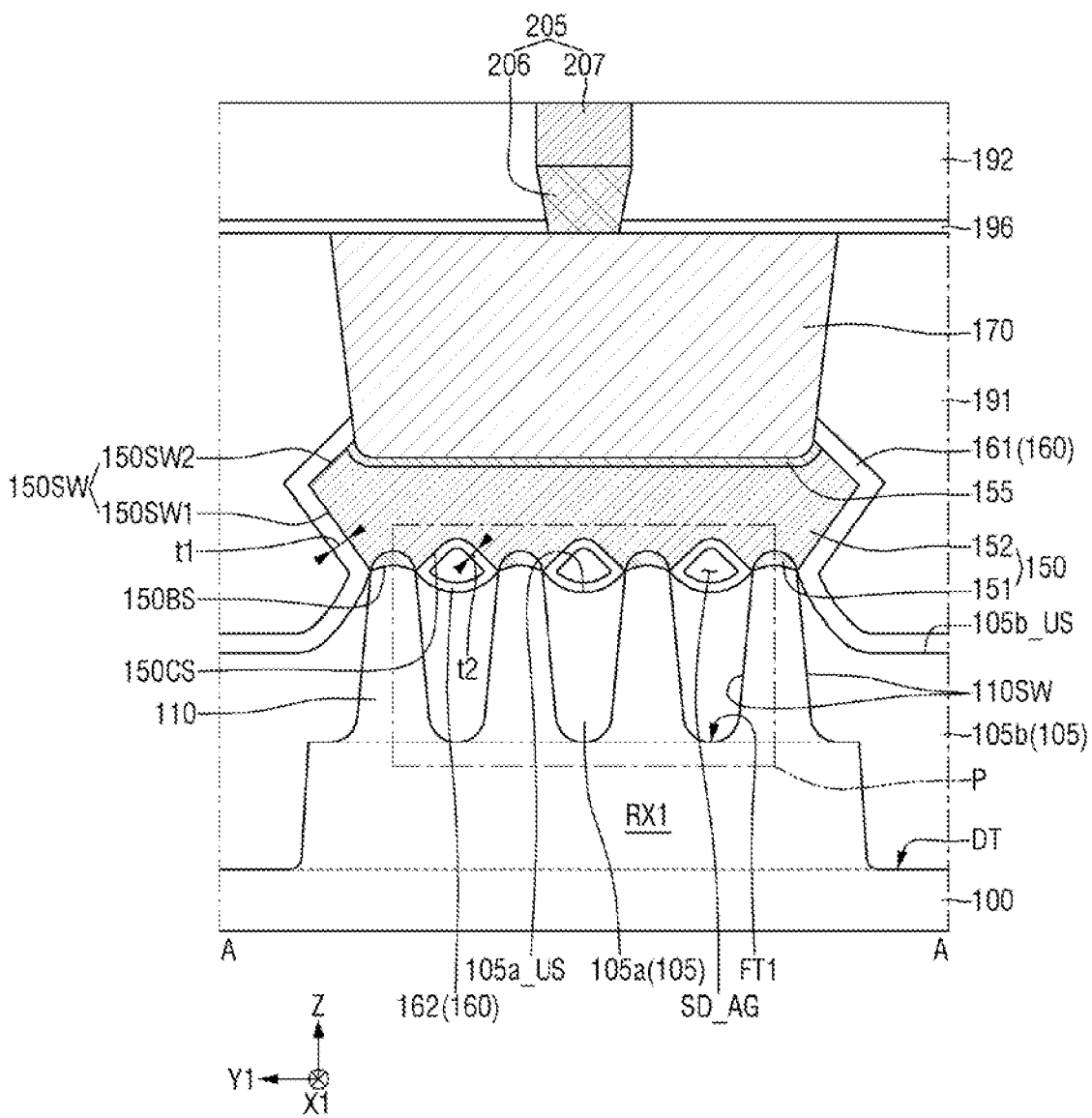
FIG. 2 is a cross-sectional view taken along line A-A of FIG. 1.
Figure 3:
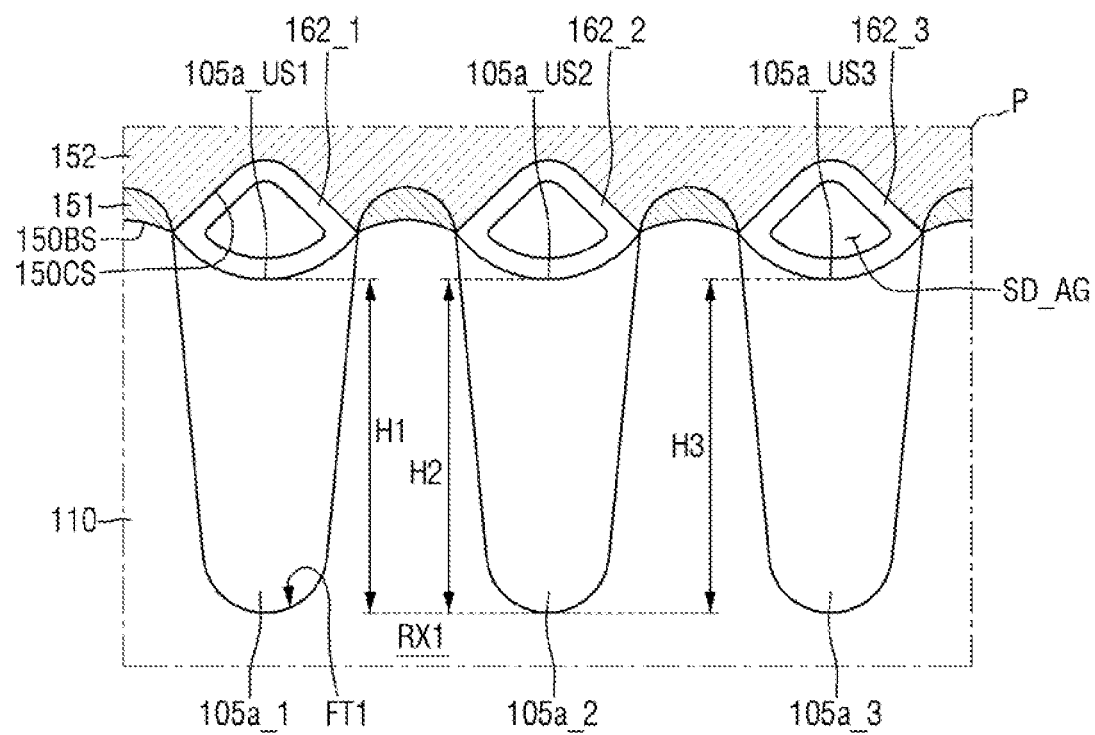
FIG. 3 is an enlarged view of portion P of FIG. 2.
Figure 4:
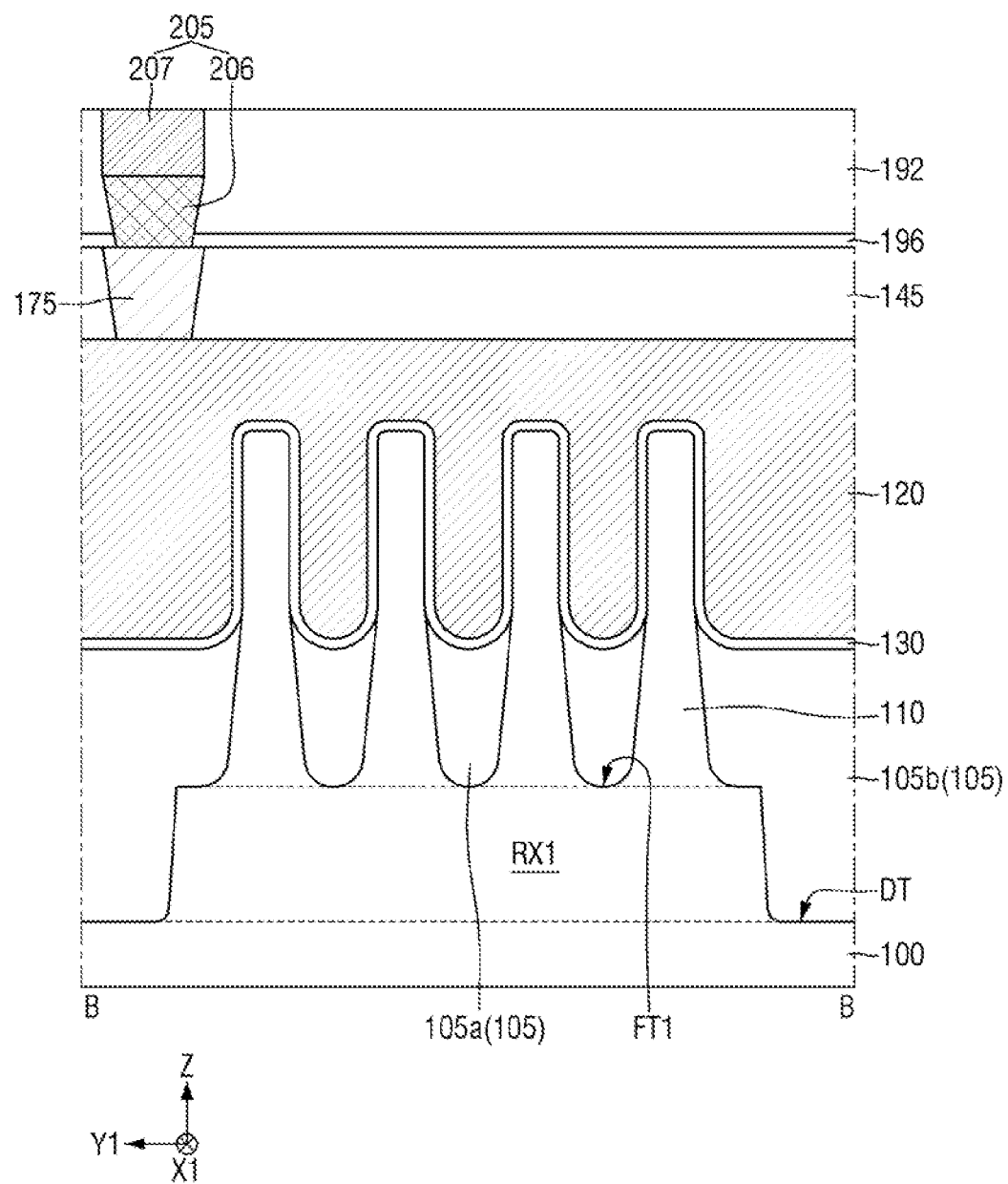
FIG. 4 is a cross-sectional view taken along line B-B of FIG. 1.
Figure 5:
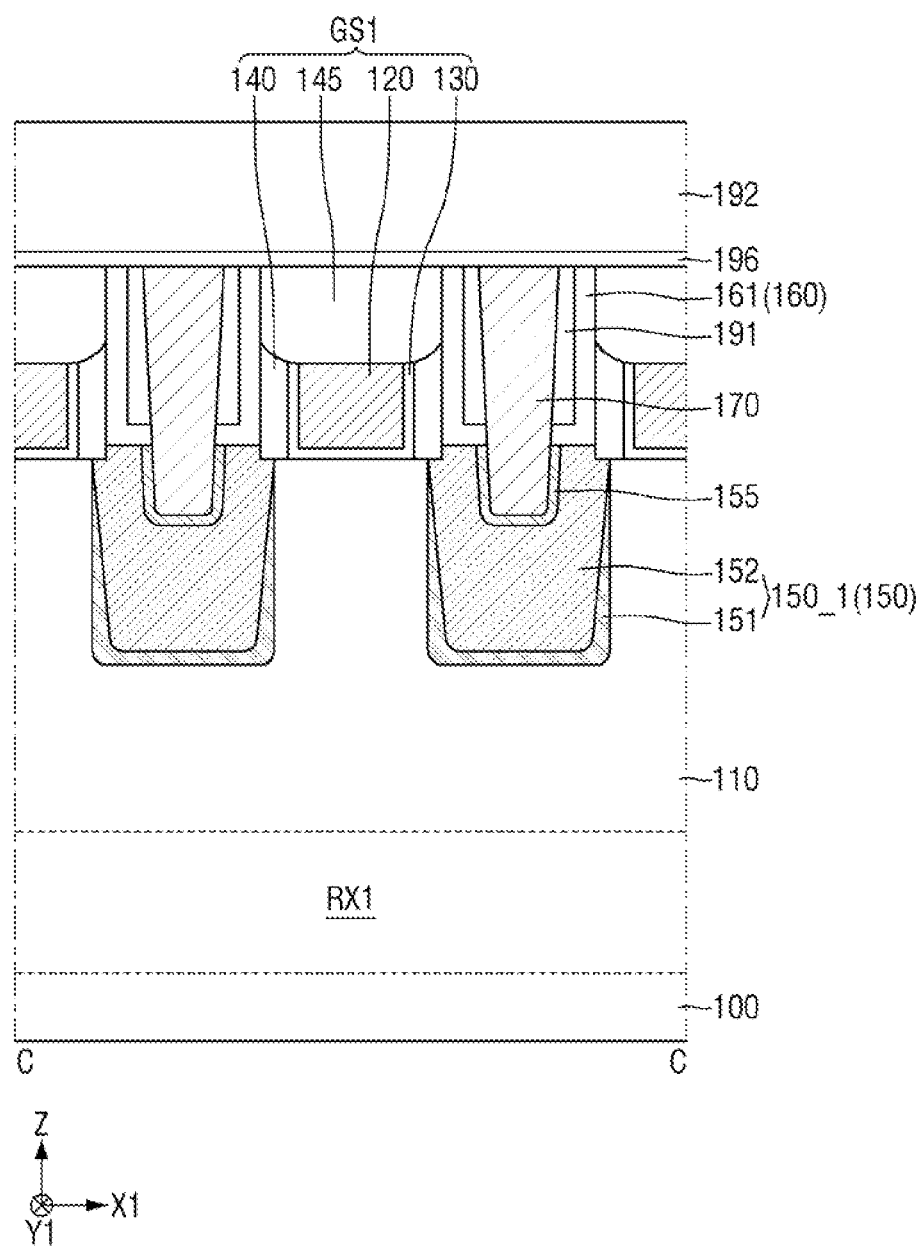
FIG. 5 is a cross-sectional view taken along line C-C of FIG. 1.
Figure 6:
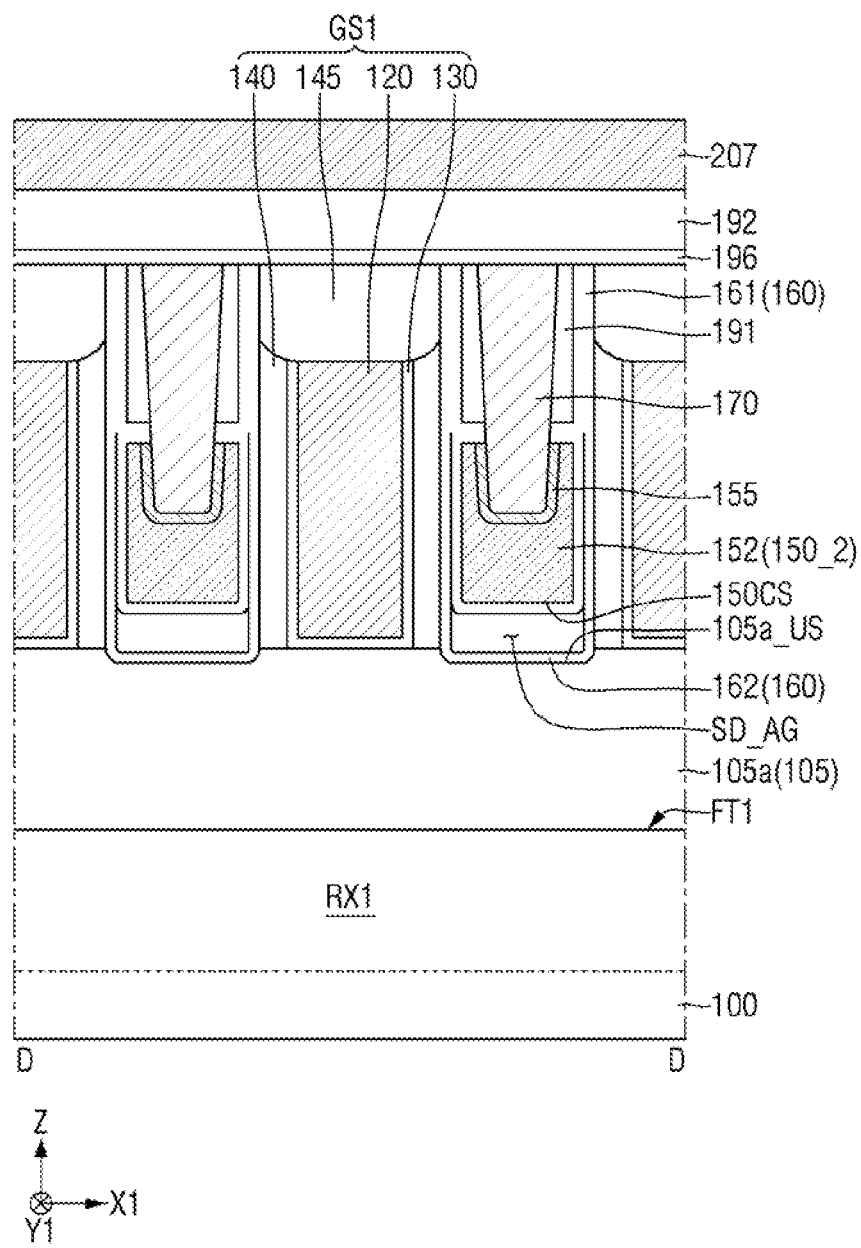
FIG. 6 is a cross-sectional view taken along line D-D of FIG. 1.
Figure 7:
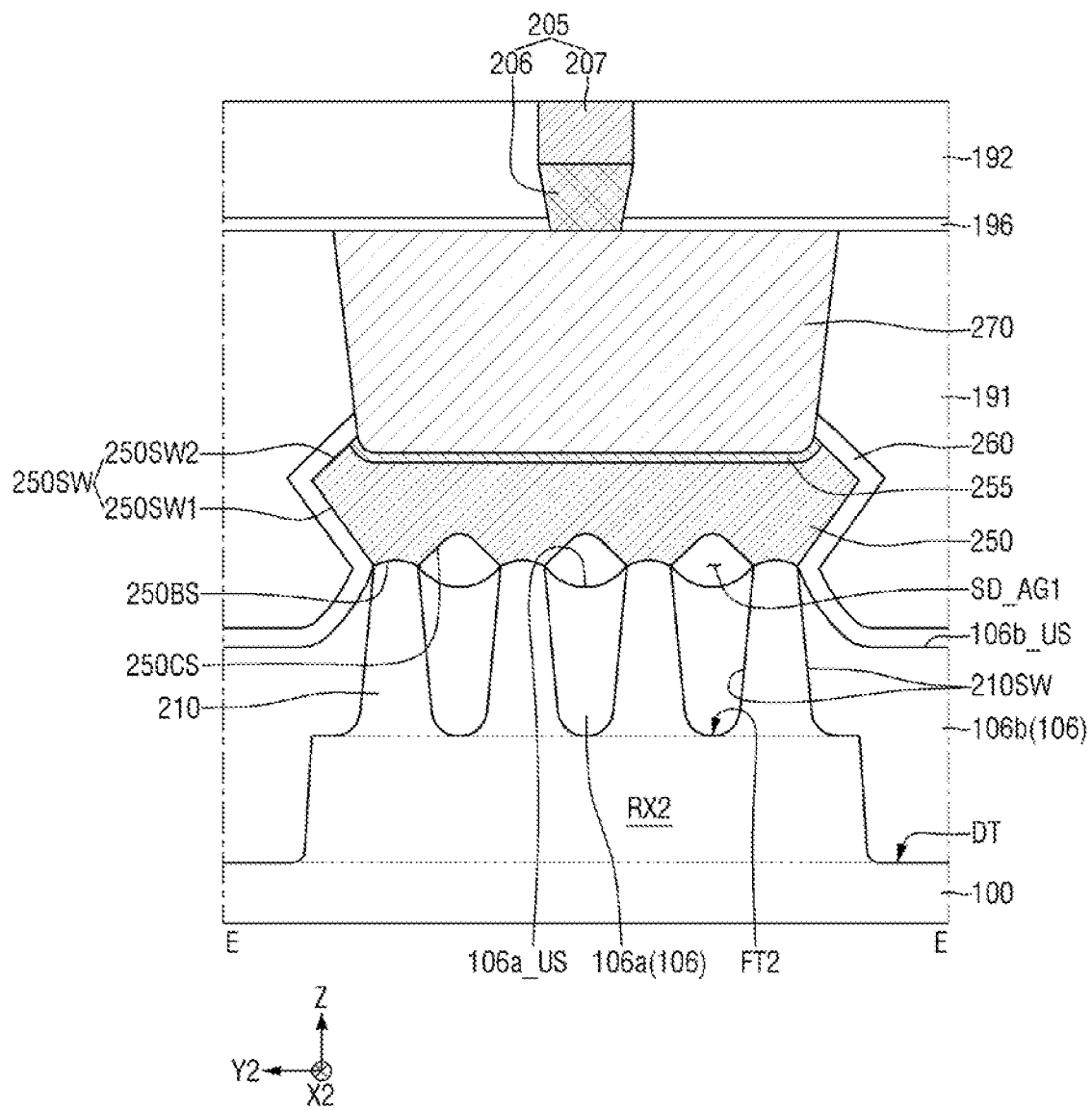
FIG. 7 is a cross-sectional view taken along line E-E of FIG. 1.
Figure 8:
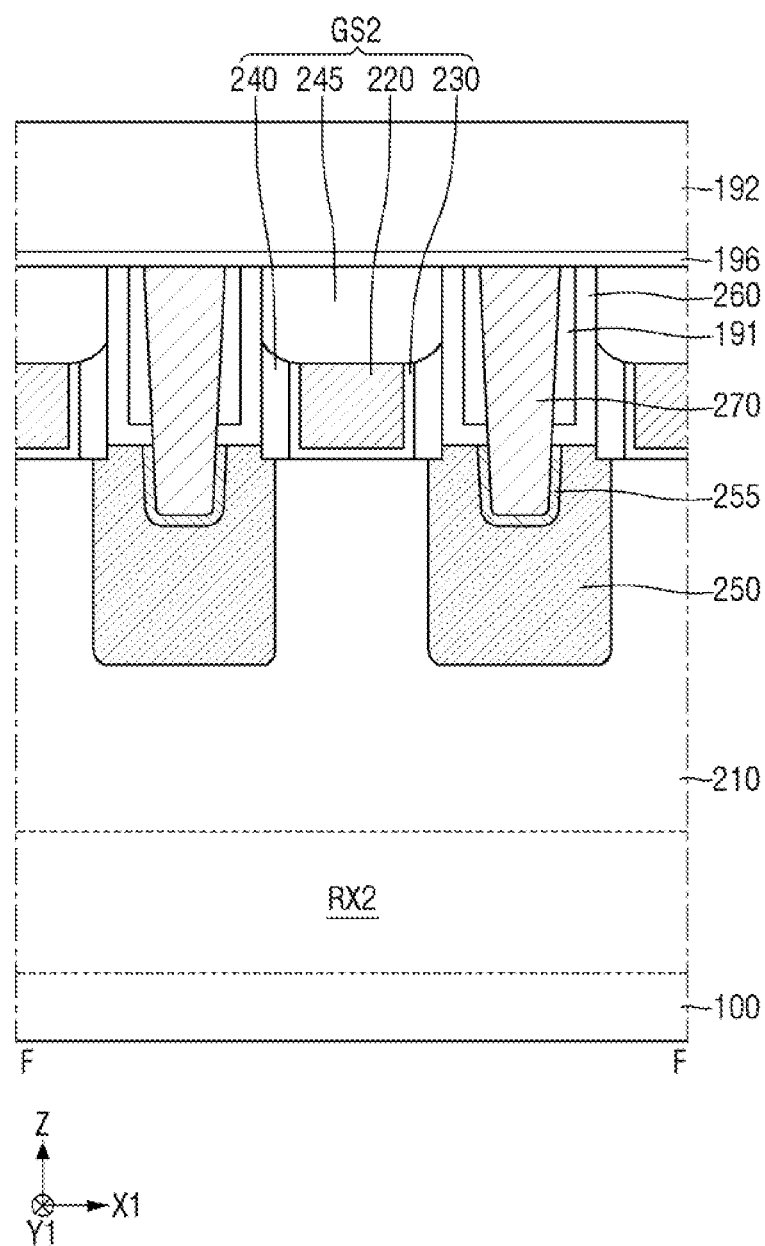
FIG. 8 is a cross-sectional view taken along line F-F of FIG. 1.
Figure 9:
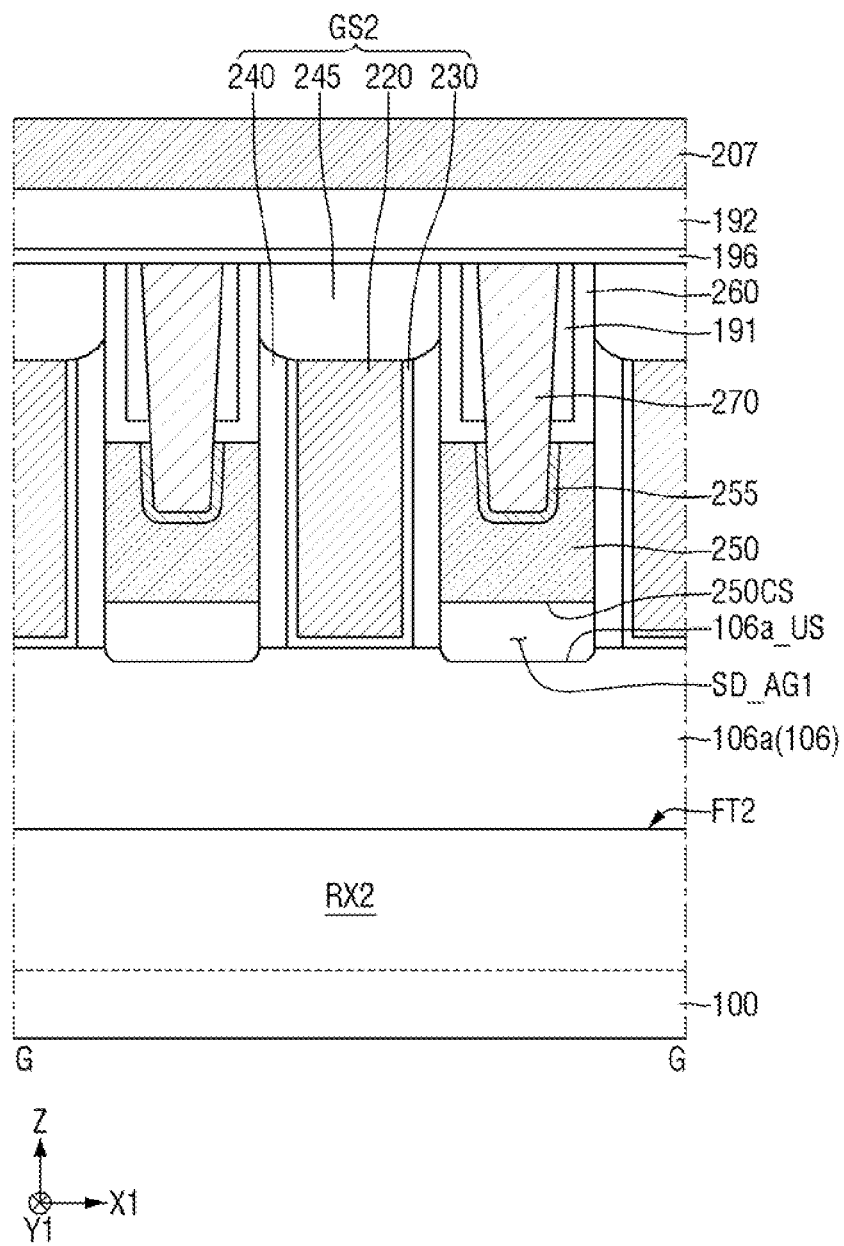
FIG. 9 is a cross-sectional view taken along line G-G of FIG. 1.

FIG. 1 is a plan view illustrating a semiconductor device according to some embodiments of the present disclosure. FIG. 2 is a cross-sectional view taken along line A-A of FIG. 1. FIG. 3 is an enlarged view of portion P of FIG. 2. FIG. 4 is a cross-sectional view taken along line B-B of FIG. 1. FIG. 5 is a cross-sectional view taken along line C-C of FIG. 1. FIG. 6 is a cross-sectional view taken along line D-D of FIG. 1. FIG. 7 is a cross-sectional view taken along line E-E of FIG. 1. FIG. 8 is a cross-sectional view taken along line F-F of FIG. 1. FIG. 9 is a cross-sectional view taken along line G-G of FIG. 1.

For simplicity of description, FIG. 1 omits the illustration of sealing insulating patterns 160 and 260, gate insulating layers 130 and 230, contacts 170, 175, and 270, a via plug 206, and a wiring line 207.

Referring to FIGS. 1 to 9, a semiconductor device according to some embodiments of the present disclosure may include a plurality of first fin-shaped patterns 110, a plurality of second fin-shaped patterns 210, a first gate electrode 120, a second gate electrode 220, a first source/drain pattern 150, a second source/drain pattern 250, a first sealing insulating pattern 160, and a second sealing insulating pattern 260.

A substrate 100 may include a first region I and a second region II. The first region I may be a region in which a p-channel metal-oxide semiconductor (PMOS) is formed. The second region II may be a region in which an n-channel metal-oxide semiconductor (NMOS) is formed.

As an example, the first region I and the second region II may perform the same function. For example, the first region I and the second region II of the substrate 100 may be input/output (I/O) regions involved in input/output of the semiconductor device, but the present disclosure is not limited thereto. As another example, the first region I and the second region II may perform different functions.

The substrate 100 may be a bulk silicon or silicon-on-insulator (SOI) substrate. Alternatively, the substrate 100 may be a silicon substrate, or may include other materials such as silicon germanium, silicon germanium on insulator (SGOI), indium antimonide, a lead tellurium compound, indium arsenide, indium phosphide, gallium arsenide, or gallium antimonide, but is not limited thereto.

The plurality of first fin-shaped patterns 110 may be disposed in the first region I of the substrate 100. The first fin-shaped patterns 110 may be disposed in a first active region RX1. The first fin-shaped patterns 110 may protrude from the substrate 100, e.g., the first active region RX1.

The first fin-shaped patterns 110 may be elongated along a first direction X1. The first fin-shaped patterns 110 may be spaced apart from each other in a second direction Y1 intersecting the first direction X1. In other words, the plurality of first fin-shaped patterns 110 may be arranged in the second direction Y1 while being spaced apart from each other in the second direction Y1.

The first fin-shaped pattern 110 may be defined by a first fin trench FT1 extending in the first direction X1. The first fin trench FT1 may form a sidewall 110SW of the first fin-shaped pattern 110.

The plurality of second fin-shaped patterns 210 may be disposed in the second region II of the substrate 100. The second fin-shaped pattern 210 may be disposed in a second active region RX2. The second fin-shaped pattern 210 may protrude from the substrate 100, e.g., the second active region RX2.

The second fin-shaped pattern 210 may be elongated along a third direction X2. The second fin-shaped patterns 210 may be spaced apart from each other in a fourth direction Y2 intersecting the third direction X2. In other words, the plurality of second fin-shaped patterns 210 may be arranged in the fourth direction Y2 while being spaced apart from each other in the fourth direction Y2.

The second fin-shaped pattern 210 may be defined by a second fin trench FT2 extending in the third direction X2. The second fin trench FT2 may form a sidewall 210SW of the second fin-shaped pattern 210.

The first direction X1 and the second direction Y1 may intersect a fifth direction Z. The third direction X2 and the fourth direction Y2 may intersect the fifth direction Z. The fifth direction Z may be a direction perpendicular to the upper surface of the substrate 100.

The first active region RX1 and the second active region RX2 may be defined by a deep trench DT. The deep trench DT is deeper than the first fin trench FT1 and the second fin trench FT2. For example, the deep trench DT may be elongated in the first direction X1 or the third direction X2.

Although it is illustrated that the number of the first fin-shaped patterns 110 disposed in the first active region RX1 is the same as the number of the second fin-shaped patterns 210 disposed in the second active region RX2, the present disclosure is not limited thereto. In addition, although the number of the first fin-shaped patterns 110 and the number of the second fin-shaped patterns 210 are each shown as four, the present disclosure is not limited thereto. For example, the number of the first fin-shaped patterns 110 may be two or more. The number of the second fin-shaped patterns 210 may be two or more.

Each of the first fin-shaped pattern 110 and the second fin-shaped pattern 210 may be a part of the substrate 100 and may include an epitaxial layer grown from the substrate 100. Each of the first fin-shaped pattern 110 and the second fin-shaped pattern 210 may include, for example, silicon or germanium, which is an elemental semiconductor material. In addition, the first fin-shaped pattern 110 and the second fin-shaped pattern 210 may include a compound semiconductor, for example, a group IV-IV compound semiconductor or a group III-V compound semiconductor.

The group IV-IV compound semiconductor may be a binary compound or a ternary compound including at least two elements selected from the group consisting of carbon (C), silicon (Si), germanium (Ge) and tin (Sn), or the above-mentioned compound doped with a group IV element.

The group III-V compound semiconductor may be, for example, a binary compound, a ternary compound or a quaternary compound formed by combining at least one of aluminum (Al), gallium (Ga) and indium (In) which are group III elements with one of phosphorus (P), arsenic (As) and antimony (Sb) which are group V elements.

As an example, the first fin-shaped pattern 110 and the second fin-shaped pattern 210 may be a silicon fin-shaped pattern. As another example, the first fin-shaped pattern 110 may be a fin-shaped pattern including a silicon-germanium pattern, and the second fin-shaped pattern 210 may be a silicon fin-shaped pattern.

A first field insulating layer 105 and a second field insulating layer 106 may be formed on the substrate 100. The first field insulating layer 105 may be disposed in the first region I of the substrate 100. The second field insulating layer 106 may be disposed in the second region II of the substrate 100.

The first field insulating layer 105 may fill the deep trench DT. The first field insulating layer 105 may fill a part of the first fin trench FT1. The first field insulating layer 105 may cover at least a part of the sidewalls 110SW of the plurality of first fin-shaped patterns 110.

The first field insulating layer 105 may include a first inner field insulating layer 105a and a first outer field insulating layer 105b. The first inner field insulating layer 105a may be disposed between the first fin-shaped patterns 110 adjacent to each other in the second direction Y1. The first outer field insulating layer 105b may be disposed around the first active region RX1. In the first fin-shaped pattern 110 disposed at the outermost portion of the first active region RX1, the first sidewall 110SW of the first fin-shaped pattern 110 may be covered with the first inner field insulating layer 105a, and the second sidewall 110SW of the first fin-shaped pattern 110 may be covered with the first outer field insulating layer 105b. The first sidewall 110SW of the first fin-shaped pattern 110 and the second sidewall 110SW of the first fin-shaped pattern 110 are opposite to each other in the second direction Y1.

A part of the first fin-shaped pattern 110 may protrude more upward than an upper surface 105a_US of the first inner field insulating layer 105a and an upper surface 105b_US of the first outer field insulating layer 105b. With respect to the bottom surface of the deep trench DT, the lowermost portion of the upper surface 105a_US of the first inner field insulating layer 105a may be higher than the lowermost portion of the upper surface 105b_US of the first outer field insulating layer 105b.

The second field insulating layer 106 may fill a deep trench DT. The second field insulating layer 106 may fill a part of the second fin trench FT2. The second field insulating layer 106 may cover the sidewalls 210SW of the plurality of second fin-shaped patterns 210.

The second field insulating layer 106 may include a second inner field insulating layer 106a and a second outer field insulating layer 106b. The second inner field insulating layer 106a may be disposed between the second fin-shaped patterns 210 adjacent to each other in the fourth direction Y2. The second outer field insulating layer 106b may be disposed around the second active region RX2. In the second fin-shaped pattern 210 disposed at the outermost portion of the second active region RX2, the first sidewall 210SW of the second fin-shaped pattern 210 may be covered with the second inner field insulating layer 106a, and the second sidewall 210SW of the second fin-shaped pattern 210 may be covered with the second outer field insulating layer 106b. The first sidewall 210SW of the second fin-shaped pattern 210 and the second sidewall 210SW of the second fin-shaped pattern 210 are opposite to each other in the fourth direction Y2.

A part of the second fin-shaped pattern 210 may protrude more upward than an upper surface 106a US of the second inner field insulating layer 106a and an upper surface 106b_US of the second outer field insulating layer 106b. With respect to the bottom surface of the deep trench DT, the lowermost portion of the upper surface 106a_US of the second inner field insulating layer 106a may be higher than the lowermost portion of the upper surface 106b_US of the second outer field insulating layer 106b.

Each of the first field insulating layer 105 and the second field insulating layer 106 may include an insulating material. For example, each of the first field insulating layer 105 and the second field insulating layer 106 may include an oxide layer, a nitride layer, an oxynitride layer, or a combination layer thereof, but is not limited thereto. Although the first field insulating layer 105 and the second field insulating layer 106 are each illustrated as a single layer, this is merely for simplicity of description and the present disclosure is not limited thereto.

A plurality of first gate structures GS1 may be provided in the first region I of the substrate 100. The first gate structure GS1 may extend in the second direction Y1. The first gate structure GS1 may include the first gate electrode 120, a first gate insulating layer 130, a first gate spacer 140, and a first gate capping pattern 145.

A plurality of second gate structures GS2 may be provided in the second region II of the substrate 100. The second gate structure GS2 may extend in the fourth direction Y2. The second gate structure GS2 may include the second gate electrode 220, a second gate insulating layer 230, a second gate spacer 240, and a second gate capping pattern 245.

The first gate electrode 120 may be disposed in the first region I of the substrate 100. The first gate electrode 120 may be disposed on the first field insulating layer 105. The first gate electrode 120 may extend in the second direction Y1.

The first gate electrode 120 may be disposed on the first fin-shaped pattern 110. The first gate electrode 120 may cross the plurality of first fin-shaped patterns 110. The first gate electrodes 120 adjacent to each other may be spaced apart from each other in the first direction X1.

The second gate electrode 220 may be disposed in the second region II of the substrate 100. The second gate electrode 220 may be disposed on the second field insulating layer 106. The second gate electrode 220 may extend in the fourth direction Y2.

The second gate electrode 220 may be disposed on the second fin-shaped pattern 210. The second gate electrode 220 may cross the plurality of second fin-shaped patterns 210. The second gate electrodes 220 adjacent to each other may be spaced apart from each other in the third direction X2.

As an example, the first gate electrode 120 may only cross the first fin-shaped pattern 110 disposed in the first active region RX1. As another example, the first gate electrode 120 may extend in the second direction Y1 to intersect a fin-shaped pattern in another active region adjacent to the first active region RX1 in the second direction Y1.

Similarly, the second gate electrode 220 may only cross the second fin-shaped pattern 210 disposed in the second active region RX2. As another example, the second gate electrode 220 may extend in the fourth direction Y2 to intersect a fin-shaped pattern in another active region adjacent to the second active region RX2 in the fourth direction Y2.

A cross-sectional view of the second gate electrode 220 taken in the fourth direction Y2 may be similar to that of FIG. 4. In addition, FIG. 8, which is a cross-sectional view of the second fin-shaped pattern 210 taken in the third direction X2, may be similar to that of FIG. 5, which is a cross-sectional view of the first fin-shaped pattern 110 taken in the first direction X1. In other words, the description of the first gate structure GS1 may be applied to the second gate structure GS2.

Accordingly, the following description will focus on the first gate electrode 120, the first gate insulating layer 130, the first gate spacer 140, and the first gate capping pattern 145 disposed in the first region I of the substrate 100.

The first gate electrode 120 may surround the first fin-shaped pattern 110 protruding more upward than the upper surfaces 150a US and 105b US of the first field insulating layer 105.

Each of the first gate electrode 120 and the second gate electrode 220 may include, for example, at least one selected from the group consisting of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof.

Each of the first gate electrode 120 and the second gate electrode 220 may include conductive metal oxide, conductive metal oxynitride or the like, and may include an oxidized form of the aforementioned material.

The first gate spacer 140 may be disposed on the sidewall of the first gate electrode 120. The first gate spacer 140 may extend in the second direction Y1. The first gate spacer 140 may include, for example, at least one of silicon nitride (SiN), silicon oxynitride (SION), silicon oxide ($SiO_2$), silicon oxynitride (SiOCN), silicon boronitride (SiBN), silicon oxyboronitride (SIOBN), silicon oxycarbide (SiOC) or a combination thereof.

A first gate insulating layer 130 may extend along the sidewall and the bottom surface of the first gate electrode 120. The first gate insulating layer 130 may be in direct contact with the sidewall and the bottom surface of the first gate electrode 120. The first gate insulating layer 130 may be formed on the first fin-shaped pattern 110 and the first field insulating layer 105. In other words, the first gate insulating layer 130 may contact the first fin-shaped pattern 110 and the first field insulating layer 105. The first gate insulating layer 130 may be formed between the first gate electrode 120 and the first gate spacer 140.

The first gate insulating layer 130 may be formed along the profile of the first fin-shaped pattern 110 protruding more upward than the first field insulating layer 105 and along the upper surfaces 105a_US and 105b US of the first field insulating layer 105. An interface layer may be further formed along the profile of the first fin-shaped pattern 110 protruding more upward than the first field insulating layer 105. Each of the first gate insulating layers 130 may be formed on the interface layer.

The first gate insulating layer 130 may include silicon oxide, silicon oxynitride, silicon nitride, or a high-k material having a higher dielectric constant than silicon oxide. The high-k material may include, for example, at least one selected from the group consisting of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The semiconductor device according to some embodiments of the present disclosure may include a negative capacitor (NC) FET using a negative capacitor (NC). For example, the first gate insulating layer 130 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and the capacitance of each capacitor has a positive value, the total capacitance becomes smaller than the capacitance of each capacitor. On the other hand, when at least one of the capacitances of two or more capacitors connected in series has a negative value, the total capacitance may have a positive value and may be greater than the absolute value of each capacitance.

When a ferroelectric material layer having a negative capacitance and a paraelectric material layer having a positive capacitance are connected in series, the total capacitance value of the ferroelectric material layer and the paraelectric material layer connected in series may increase. By using the principle that the total capacitance value is increased, the transistor containing the ferroelectric material layer may have a subthreshold swing (SS) lower than or equal to a threshold voltage lower than 60 m V/decade at room temperature.

The ferroelectric material layer may have ferroelectric properties. The ferroelectric material layer may include, for example, at least one of hafnium oxide, hafnium zirconium oxide, barium strontium titanium oxide, barium titanium oxide, or lead zirconium titanium oxide. In this case, as one example, the hafnium zirconium oxide may be a material containing hafnium oxide doped with zirconium (Zr). As another example, the hafnium zirconium oxide may be a compound of hafnium (Hf), zirconium (Zr), and oxygen (O).

The ferroelectric material layer may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material layer may vary depending on which ferroelectric material is included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), or yttrium (Y).

When the dopant is aluminum (Al), the ferroelectric material layer may include 3 to 8 atomic percent (at %) of aluminum. In this case, the ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have paraelectric properties. The paraelectric material layer may include, for example, at least one of silicon oxide or metal oxide having a high dielectric constant. The metal oxide included in the paraelectric material layer may include, for example, at least one of hafnium oxide, zirconium oxide, or aluminum oxide, but is not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, the crystal structure of the hafnium oxide included in the ferroelectric material layer is different from the crystal structure of the hafnium oxide included in the paraelectric material layer.

The ferroelectric material layer may have a thickness that exhibits ferroelectric properties. The thickness of the ferroelectric material layer may be, for example, in a range of 0.5 nm to 10 nm, but is not limited thereto. Since a critical thickness at which each ferroelectric material exhibits ferroelectric properties may be different, the thickness of the ferroelectric material layer may vary depending on the ferroelectric material.

In one example, the first gate insulating layer 130 may include one ferroelectric material layer. In another example, the first gate insulating layer 130 may include a plurality of ferroelectric material layers spaced apart from each other. The first gate insulating layer 130 may have a laminated layer structure in which a plurality of ferroelectric material layers and a plurality of paraelectric material layers are alternately laminated.

The first gate capping pattern 145 may be disposed on the upper surface of the first gate electrode 120 and the upper surface of the first gate spacer 140. The first gate capping pattern 145 may include, for example, at least one of silicon nitride (SiN), silicon oxynitride (SION), silicon oxide ($SiO_2$), silicon carbonitride (SiCN), silicon oxycarbonitride (SiOCN), or a combination thereof.

Unlike the illustrated example, the first gate capping pattern 145 may be disposed between the first gate spacers 140. In this case, the upper surface of the first gate capping pattern 145 may lie on the same plane as the upper surface of the first gate spacer 140.

The first source/drain pattern 150 may be disposed on the first field insulating layer 105. The first source/drain pattern 150 may be disposed in the first active region RX1.

The first source/drain pattern 150 may be disposed on the plurality of first fin-shaped patterns 110. The first source/drain pattern 150 may be connected to the plurality of first fin-shaped patterns 110. In this case, the first source/drain pattern 150 may contact the plurality of first fin-shaped patterns 110.

The first source/drain pattern 150 may be disposed between the first gate structures GS1 adjacent to each other in the first direction X1. The first source/drain pattern 150 may be in contact with the first gate spacer 140 of the first gate structure GS1. For example, the first source/drain pattern 150 may contact an end portion of the first gate spacer 140 of the first gate structure GS1.

The second source/drain pattern 250 may be disposed on the second field insulating layer 106. The second source/drain pattern 250 may be disposed in the second active region RX2.

The second source/drain pattern 250 may be disposed on the plurality of second fin-shaped patterns 210. The second source/drain pattern 250 may be connected to the plurality of second fin-shaped patterns 210. In this case, the second source/drain pattern 250 may contact the plurality of second fin-shaped patterns 110.

The second source/drain pattern 250 may be disposed between the second gate structures GS2 adjacent to each other in the third direction X2. The second source/drain pattern 250 may be in contact with the second gate spacer 240 of the second gate structure GS2. For example, the second source/drain pattern 250 may contact an end portion of the second gate spacer 240 of the second gate structure GS2.

Since the first source/drain pattern 150 is connected to the plurality of first fin-shaped patterns 110 and the second source/drain pattern 250 is connected to the plurality of second fin-shaped patterns 210, each of the first source/drain pattern 150 and the second source/drain pattern 250 may be a shared source/drain pattern.

The first source/drain pattern 150 and the second source/drain pattern 250 may be included in the source/drain of the transistor using the first fin-shaped pattern 110 and the second fin-shaped pattern 210 as channel regions.

In a plan view, the first source/drain pattern 150 may include first portions 150_1 and second portions 150_2. The second portion 150_2 of the first source/drain pattern 150 may be disposed between the first portions 150_1 of the first source/drain pattern 150. For example, the second portion 150_2 of the first source/drain pattern 150 may connect adjacent first portions 150_1 of the first source/drain pattern 150 to each other.

The first portion 150_1 of the first source/drain pattern 150 may overlap the first fin-shaped pattern 110 in the fifth direction Z. The second portion 150_2 of the first source/drain pattern 150 may be disposed between the first fin-shaped patterns 110 adjacent to each other in the second direction Y1. The second portion. 150_2 of the first source/drain pattern 150 may overlap, in the fifth direction Z, the first field insulating layer 105 disposed between the first fin-shaped patterns 110. The second portion 150_2 of the first source/drain pattern 150 may overlap the first inner field insulating layer 105a in the fifth direction Z. The second portion 150_2 of the first source/drain pattern 150 may not overlap the first fin-shaped pattern 110 in the fifth direction Z.

At a terminating portion of the first source/drain pattern 150, as shown in the second portion 150_2 of the first source/drain pattern 150, the first source/drain pattern 150 may include a portion whose width in the first direction X1 decreases.

In a plan view, the second portion 150_2 of the first source/drain pattern 150 may include an inclined surface extending from the first gate spacer 140. In other words, the second portion 150_2 of the first source/drain pattern 150 may include a facet extending from the first gate spacer 140.

In the first portion 150_1 of the first source/drain pattern 150, the first source/drain pattern 150 may have a first width W1 in the first direction X1. In the second portion 150_2 of the first source/drain pattern 150, the width of the first source/drain pattern 150 in the first direction X1 may decrease from the first width W1 to the second width W2, and then increase to the first width W1 again. In the second portion 150_2 of the first source/drain pattern 150, the first width W1 of the first source/drain pattern 150 is greater than the second width W2 of the first source/drain pattern 150.

In a plan view, the width of the second source/drain pattern 250 in the third direction X2 may be maintained constant.

In FIG. 6, the second portion 150_2 of the first source/drain pattern 150 is not in contact with the first gate spacers 140 disposed on both sides thereof. A separation space exists between the second portion 150_2 of the first source/drain pattern 150 and the first gate spacer 140. A material may be provided in the separation space or the separation space may be empty.

In FIGS. 1 and 9, the second source/drain pattern 250 on the second field insulating layer 106 separated in the fourth direction Y2 is in contact with the second gate spacer 240 disposed on both sides thereof. In other words, a separation space does not exist between the second source/drain pattern 250 and the second gate spacer 240.

The first source/drain pattern 150 may include bottom surfaces 150BS, outer sidewalls 150SW, and connection surfaces 150CS. The first source/drain pattern 150 may be connected to each of the first fin-shaped patterns 110 through the bottom surface ISOBS of the first source/drain pattern 150. For example, the bottom surface 150BS of the first source/drain pattern 150 may contact the first fin-shaped pattern 110. The connection surface 150CS of the first source/drain pattern 150 may connect adjacent bottom surfaces 150BS of the first source/drain pattern 150 to each other. The bottom surface 150BS of the first source/drain pattern 150 is illustrated as being curved, but is not limited thereto.

The number of the bottom surfaces 150BS included in the first source/drain pattern 150 is the same as the number of the first fin-shaped patterns 110. The first source/drain pattern 150 includes the plurality of bottom surfaces 150BS. The number of the connection surfaces 150CS included in the first source/drain pattern 150 is one less than the number of the first fin-shaped patterns 110. The first source/drain pattern 150 includes at least one connection surface 150CS.

The outer sidewall 150SW of the first source/drain pattern 150 may extend in the fifth direction Z. The outer sidewall 150SW of the first source/drain pattern 150 may be directly connected to the bottom surface 150BS of the first source/drain pattern 150. The outer sidewall 150SW of the first source/drain pattern 150 may include a lower sidewall 150SW1 and an upper sidewall 150SW2.

The lower sidewall 150SW1 of the first source/drain pattern 150 may be directly connected to the bottom surface 150BS of the first source/drain pattern 150. A facet intersection point of the first source/drain pattern 150 may be a point where the lower sidewall 150SW1 of the first source/drain pattern 150 and the upper sidewall 150SW2 of the first source/drain pattern 150 meet. Between the lower sidewalls 150SW1 of the first source/drain pattern 150, the width of the first source/drain pattern 150 in the second direction Y1 may increase as the distance from the substrate 100 increases. Between the upper sidewalls 150SW2 of the first source/drain pattern 150, the width of the first source/drain pattern 150 in the second direction Y1 may decrease as the distance from the substrate 100 increases. The facet intersection point of the first source/drain pattern 150 may be a point where the width of the first source/drain pattern 150 in the second direction Y1 that has increased starts to decrease as the distance from the substrate 100 increases.

The first source/drain pattern 150 may include a plurality of first lower epitaxial regions 151 and a first upper epitaxial region 152. The first source/drain pattern 150 may further include a capping epitaxial region formed along the outer circumferential surface of the first upper epitaxial region 152.

The first lower epitaxial region 151 may be disposed on each of the first fin-shaped patterns 110. For example, the first lower epitaxial region 151 may be in contact with the first fin-shaped pattern 110. The first source/drain pattern 150 may be connected to the first fin-shaped pattern 110 through the first lower epitaxial region 151. The first lower epitaxial region 151 may form the bottom surface 150BS of the first source/drain pattern 150.

The first upper epitaxial region 152 may be disposed on the first lower epitaxial regions 151. The first upper epitaxial region 152 may connect the first lower epitaxial regions 151 to each other. The first upper epitaxial region 152 is disposed above the plurality of first fin-shaped patterns 110. The first upper epitaxial region 152 is formed across the plurality of first fin-shaped patterns 110.

Each of the first lower epitaxial region 151 and the first upper epitaxial region 152 may include silicon-germanium. The first lower epitaxial region 151 and the first upper epitaxial region 152 may be a silicon-germanium pattern grown using an epitaxial process. Each of the first lower epitaxial region 151 and the first upper epitaxial region 152 may include a p-type impurity. In other words, each of the first lower epitaxial region 151 and the first upper epitaxial region 152 may be a silicon-germanium pattern doped with a p-type impurity.

The germanium fraction of the first lower epitaxial region 151 may be different from the germanium fraction of the first upper epitaxial region 152. For example, the germanium fraction of the first lower epitaxial region 151 may be smaller than the germanium fraction of the first upper epitaxial region 152.

When the first source/drain pattern 150 includes a capping epitaxial region, the capping epitaxial region may include silicon or silicon-germanium, but is not limited thereto.

Since the first source/drain pattern 150 includes the second portion 150_2 of the first source/drain pattern 150, a device capacitance between the first source/drain pattern 150 and the first gate electrode 120 may be reduced. In addition, the contact area between the first source/drain pattern 150 and the first gate structure GS1 is reduced, so that the possibility of contact between the first source/drain pattern 150 and the first gate electrode 120 is reduced. In other words, the possibility of a short circuit between the first gate electrode 120 and the first source/drain pattern 150 is reduced. As a result, performance and reliability of the semiconductor device may be improved.

The second source/drain pattern 250 may include bottom surfaces 250BS, outer sidewalls 250SW, and connection surfaces 250CS. The second source/drain pattern 250 may be connected to each of the second fin-shaped patterns 210 through the bottom surface 250BS of the second source/drain pattern 250. The connection surface 250CS of the second source/drain pattern 250 may connect adjacent bottom surfaces 250BS of the second source/drain pattern 250 to each other. The bottom surface 250BS of the second source/drain pattern 250 is illustrated as being curved, but is not limited thereto.

The number of the bottom surfaces 250BS included in the second source/drain pattern 250 is the same as the number of the second fin-shaped patterns 210. The second source/drain pattern 250 includes the plurality of bottom surfaces 250BS. The number of the connection surfaces 250CS included in the second source/drain pattern 250 is one less than the number of the second fin-shaped patterns 210. The second source/drain pattern 250 includes at least one connection surface 250CS.

The outer sidewall 250SW of the second source/drain pattern 250 may extend in the fifth direction Z. The outer sidewall 250SW of the second source/drain pattern 250 may be directly connected to the bottom surface 250BS of the second source/drain pattern. The outer sidewall 250SW of the second source/drain pattern 250 may include a lower sidewall 250SW1 and an upper sidewall 250SW2.

The lower sidewall 250SW1 of the second source/drain pattern 250 may be directly connected to the bottom surface 250BS of the second source/drain pattern 250. A facet intersection point of the second source/drain pattern 250 may be a point where the lower sidewall 250SW1 of the second source/drain pattern 250 and the upper sidewall 250SW2 of the second source/drain pattern 250 meet. Between the lower sidewalls 250SW1 of the second source/drain pattern 250, the width of the second source/drain pattern 250 in the fourth direction Y2 may increase as the distance from the substrate 100 increases. Between the upper sidewalls 250SW2 of the second source/drain pattern 250, the width of the second source/drain pattern 250 in the fourth direction Y2 may decrease as the distance from the substrate 100 increases. The facet intersection point of the second source/drain pattern 250 may be a point where the width of the second source/drain pattern 250 in the fourth direction Y2 that has increased starts to decrease as the distance from the substrate 100 increases.

The second source/drain pattern 250 may include at least one of a silicon pattern or a silicon carbide pattern, but is not limited thereto. The second source/drain pattern 250 may include an n-type impurity. The second source/drain pattern 250 may include a semiconductor pattern doped with an n-type impurity. Although the second source/drain pattern 250 is illustrated as a single layer, it is not limited thereto.

The first sealing insulating pattern 160 may extend along at least a part of the outer sidewall 150SW of the first source/drain pattern 150, the upper surface 105b US of the first outer field insulating layer 105b, and the sidewall of the first gate structure GS1. The first sealing insulating pattern 160 is disposed on the upper surface 105a_US of the first inner field insulating layer 105a and the connection surface ISOCS of the first source/drain pattern. The first sealing insulating pattern 160 may extend along the upper surface 105a_US of the first inner field insulating layer 105a and the connection surface 150CS of the first source/drain pattern 150.

The first sealing insulating pattern 160 may include a first outer sealing insulating pattern 161 and a first inner sealing insulating pattern 162. The first outer sealing insulating pattern 161 may extend along at least a part of the outer sidewall 150SW of the first source/drain pattern 150 and the upper surface 105b_US of the first outer field insulating layer 105b. The first inner sealing insulating pattern 162 may extend along the upper surface 105a_US of the first inner field insulating layer 105a and the connection surface 150CS of the first source/drain pattern 150. The first outer sealing insulating pattern 161 and the first inner sealing insulating pattern 162 may be disposed on the sidewall of the first gate structure GS1.

In the semiconductor device according to some embodiments of the present disclosure, a thickness t2 of the first inner sealing insulating pattern 162 may be different from a thickness t1 of the first outer sealing insulating pattern 161. For example, the thickness t1 of the first outer sealing insulating pattern 161 may be greater than the thickness 12 of the first inner sealing insulating pattern 162. In other words, the thickness t1 of the first sealing insulating pattern 160 on the upper surface 105b_US of the first outer field insulating layer 105b may be greater than the thickness t2 of the first sealing insulating pattern 160 on the upper surface 105a_US of the first inner field insulating layer 105a. The thickness t1 of the first sealing insulating pattern 160 on the outer sidewall 150SW of the first source/drain pattern 150 may be greater than the thickness t2 of the first sealing insulating pattern 160 on the connection surface 150CS of the first source/drain pattern 150.

In FIG. 6, the first sealing insulating pattern 160 may fill a space between the second portion 150_2 of the first source/drain pattern 150 and the first gate spacer 140. Between the second portion 150_2 of the first source/drain pattern 150 and the first gate spacer 140, the first sealing insulating pattern 160 may include a seam structure extending in the fifth direction Z.

In a process of forming the first sealing insulating pattern 160, the first sealing insulating pattern 160 on the second portion 150_2 of the first source/drain pattern 150 may be in contact with the first sealing insulating pattern 160 on the first gate spacer 140. As a result, the seam structure may be formed. Unlike the illustrated example, between the second portion 150_2 of the first source/drain pattern 150 and the first gate spacer 140, the first sealing insulating pattern 160 may not include the seam structure.

Since the first sealing insulating pattern 160 is formed on the sidewall of the first gate spacer 140 and the upper surface 105a_US of the first inner field insulating layer 150a, a short circuit between the first gate electrode 120 and the first source/drain pattern 150, which may occur during the manufacturing process, may be prevented. As a result, performance and reliability of the semiconductor device may be improved.

The second sealing insulating pattern 260 may extend along at least a part of the outer sidewall 250SW of the second source/drain pattern 250, the upper surface 106b_US of the second outer field insulating layer 106b, and the sidewall of the second gate structure GS2. The second sealing insulating pattern 260 is not disposed on the upper surface 106a_US of the second inner field insulating layer 106a and the connection surface 250CS of the second source/drain pattern 250. For example, the second sealing insulating pattern 260 does not extend along the upper surface 106a_US of the second inner field insulating layer 106a and the connection surface 250CS of the second source/drain pattern.

The second sealing insulating pattern 260 may include only an outer sealing insulating pattern without including an inner sealing insulating pattern.

Each of the first sealing insulating pattern 160 and the second sealing insulating pattern 260 may include a material having an etching selectivity with respect to a first interlayer insulating layer 191, which will be described later. Each of the first sealing insulating pattern 160 and the second sealing insulating pattern 260 may include at least one of silicon nitride (SiN), silicon oxynitride (SiON), silicon oxycarbonitride (SiOCN), silicon boronitride (SiBN), silicon oxyboronitride (SIOBN), silicon oxycarbide (SiOC), or a combination thereof.

For example, the first inner field insulating layer 105a may include a first portion 105a_1, a second portion 105a_2, and a third portion 105a_3. The second portion 105a_2 of the first inner field insulating layer 105a may be disposed between the first portion 105a_1 of the first inner field insulating layer 105a and the third portion 105a_3 of the first inner field insulating layer 105a.

The first inner sealing insulating pattern 162 may include a first sub-sealing insulating pattern 162_1, a second sub-sealing insulating pattern 162_2, and a third sub-sealing insulating pattern 162_3. The first sub-sealing insulating pattern 162_1 is disposed between the first portion 105a_1 of the first inner field insulating layer 105a and the first source/drain pattern 150. The second sub-sealing insulating pattern 162_2 is disposed between the second portion 105a_2 of the first inner field insulating layer 105a and the first source/drain pattern 150. The third sub-sealing insulating pattern 162_3 is disposed between the third portion 105a_3 of the first inner field insulating layer 105a and the first source/drain pattern 150.

The first sub-sealing insulating pattern 162_1 may extend along an upper surface 105a_US1 of the first portion 150a_1 of the first inner field insulating layer 105a and the connection surface 150CS of the first source/drain pattern 150. The second sub-sealing insulating pattern 162_2 may extend along an upper surface 105a_US2 of the second portion 150a_2 of the first inner field insulating layer 105a and the connection surface 150CS of the first source/drain pattern 150. The third sub-sealing insulating pattern 162_3 may extend along an upper surface 105a_US3 of the third portion 105a_3 of the first inner field insulating layer 105a and the connection surface 150CS of the first source/drain pattern 150.

In the semiconductor device according to some embodiments of the present disclosure, the first inner sealing insulating pattern 162 may include a sealing air gap SD_AG disposed therein. The sealing air gap SD_AG may be surrounded by the first inner sealing insulating pattern 162.

For example, each of the first sub-sealing insulating pattern 162_1, the second sub-sealing insulating pattern 162_2, and the third sub-sealing insulating pattern 162_3 may include the sealing air gap SD_AG. In other words, the sealing air gap SD_AG may be disposed above each of the first, second and third portions 150a_1, 150a_2, 150a_3 of the first inner field insulating layer 105a.

As an example, the height of the sealing air gap SD_AG included in each of the first sub-sealing insulating pattern 162_1, the second sub-sealing insulating pattern 162_2, and the third sub-sealing insulating pattern 162_3 may be the same. As another example, at least one of the sealing air gap SD_AG included in the first sub-sealing insulating pattern 162_1, the sealing air gap SD_AG included in the second sub-sealing insulating pattern 162_2, or the sealing air gap SD_AG included in the third sub-sealing insulating pattern 162_3 may have a different height.

An insertion air gap SD_AG1 may be disposed between the upper surface 106a US of the second inner field insulating layer 106a and the connection surface 250CS of the second source/drain pattern 250. The insertion air gap SD_AG1 is not surrounded by the second sealing insulating pattern 260.

In FIG. 3, the second portion 105a_2 of the first inner field insulating layer 105a may be directly adjacent to the first portion 105a_1 of the first inner field insulating layer 105a. As used herein, the term "directly adjacent" means that another first inner field insulating layer 105a is not disposed between the second portion 105a_2 of the first inner field insulating layer 105a and the first portion 105a_1 of the first inner field insulating layer 105a. The second portion 105a_2 of the first inner field insulating layer 105a may be directly adjacent to the third portion 105a_3 of the first inner field insulating layer 105a.

The height of the upper surface 105a_US1 of the first portion 105a_1 of the first inner field insulating layer 105a may be a first height H1 with respect to the bottom surface of the first fin trench FT1. The height of the upper surface 105a_US2 of the second portion 105a_2 of the first inner field insulating layer 105a may be a second height H2. The height of the upper surface 105a_US3 of the third portion 105a_3 of the first inner field insulating layer 105a may be a third height H3. Here, the height of the upper surface 105a_US of the first inner field insulating layer 105a may be a height from the bottom surface of the first fin trench FT1 to the lowest point of the upper surface 105a_US of the first inner field insulating layer 105a.

In the semiconductor device according to some embodiments of the present disclosure, the height H2 of the upper surface 105a_US2 of the second portion 105a_2 of the first inner field insulating layer 105a may be the same as the height H1 of the upper surface 105a_US1 of the first portion 105a_1 of the first inner field insulating layer 105a. The height H2 of the upper surface 105a_US2 of the second portion 105a_2 of the first inner field insulating layer 105a may be the same as the height H3 of the upper surface 105a_US3 of the third portion 105a_3 of the first inner field insulating layer 105a.

The first interlayer insulating layer 191 may be disposed on the first sealing insulating pattern 160 and the second sealing insulating pattern 260. The upper surface of the first interlayer insulating layer 191 may lie on the same plane as the upper surface of the first gate structure GS1 and the upper surface of the second gate structure GS2.

The first source/drain contact 170 may be disposed on the first source/drain pattern 150. The first source/drain contact 170 is connected to the first source/drain pattern 150. The first source/drain contact 170 may be disposed in the first interlayer insulating layer 191.

The upper surface of the first source/drain contact 170 may lie on the same plane as the upper surface of the first interlayer insulating layer 191. The upper surface of the first source/drain contact 170 may lie on the same plane as the upper surface of the first gate capping pattern 145.

The second source/drain contact 270 may be disposed on the second source/drain pattern 250. The second source/drain contact 270 is connected to the second source/drain pattern 250. The second source/drain contact 270 may be disposed in the first interlayer insulating layer 191.

The upper surface of the second source/drain contact 270 may lie on the same plane as the upper surface of the first interlayer insulating layer 191. The upper surface of the second source/drain contact 270 may lie on the same plane as the upper surface of the second gate capping pattern 245.

A first silicide layer 155 may be disposed between the first source/drain contact 170 and the first source/drain pattern 150. A second silicide layer 255 may be disposed between the second source/drain contact 270 and the second source/drain pattern 250. Each of the first silicide layer 155 and the second silicide layer 255 may contain a metal silicide material.

Unlike the illustrated example, for example, the first source/drain contact 170 and the second source/drain contact 270 may each have an L shape. As another example, the first source/drain contact 170 and the second source/drain contact 270 may each have a T shape rotated by 180 degrees.

A first gate contact 175 may be disposed on the first gate electrode 120. The first gate contact 175 is connected to the first gate electrode 120. The first gate contact 175 may be disposed in the first gate capping pattern 145. The upper surface of the first gate contact 175 may lie on the same plane as the upper surface of the first gate capping pattern 145.

A gate contact connected to the second gate electrode 220 may be disposed on the second gate electrode 220.

Each of the first source/drain contact 170, the second source/drain contact 270, and the first gate contact 175 may contain a conductive material, e.g., at least one of metal, metal nitride, metal carbonitride, a two-dimensional material (2D) material, or a conductive semiconductor material. Although it is illustrated that each of the first source/drain contact 170, the second source/drain contact 270, and the first gate contact 175 is a single layer for simplicity of description, the present disclosure is not limited thereto. In one example, the first source/drain contact 170, the second source/drain contact 270, and the first gate contact 175 may include a contact barrier layer and a contact filling layer that fills the space formed by the contact barrier layer. In another example, the first source/drain contact 170, the second source/drain contact 270, and the first gate contact 175 may include only a contact filling layer without a contact barrier layer.

The second interlayer insulating layer 192 may be disposed on the first interlayer insulating layer 191. An etch stop layer 196 may be disposed between the second interlayer insulating layer 192 and the first interlayer insulating layer 191.

Each of the first interlayer insulating layer 191 and the second interlayer insulating layer 192 may contain, e.g., at least one of silicon oxide, silicon nitride, silicon nitride, or a low dielectric constant material. The low-k material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SILK, amorphous fluorinated carbon, silica aerogels, silica xerogels, mesoporous silica, or a combination thereof, but is not limited thereto.

The etch stop layer 196 may include, for example, at least one of silicon nitride (SiN), silicon oxynitride (SION), silicon oxycarbonitride (SiOCN), silicon boronitride (SiBN), silicon oxyboronitride (SIOBN), silicon oxycarbide (SiOC), aluminum oxide (AIO), aluminum nitride (AlN) and aluminum oxycarbide (AlOC), or a combination thereof.

The wiring structure 205 may be disposed in the second interlayer insulating layer 192. A portion of the wiring structure 205 may also be disposed in the etch stop layer 196. The wiring structure 205 may include a via plug 206 and a wiring line 207. The wiring line 207 may be connected to the first and second source/drain contacts 170 and 270 and the gate contact 175 through the via plug 206.

The via plug 206 and the wiring line 207 may be formed through different manufacturing processes. A boundary between the via plug 206 and the wiring line 207 may be distinguished. Unlike the illustrated example, the via plug 206 and the wiring line 207 may have an integral structure. In this case, the boundary between the via plug 206 and the wiring line 207 may not be distinguished.

Each of the via plug 206 and the wiring line 207 may contain a conductive material, e.g., at least one of metal, metal nitride, metal carbonitride, a two-dimensional material (2D) material, or a conductive semiconductor material.

FIGS. 10 to 14 are diagrams each illustrating a semiconductor device according to some embodiments of the present disclosure. For simplicity of description, the following description will focus on differences from the description with reference to FIGS. 1 to 9. For reference, FIGS. 10 to 14 are enlarged views of part P of FIG. 2.

Figure 10:
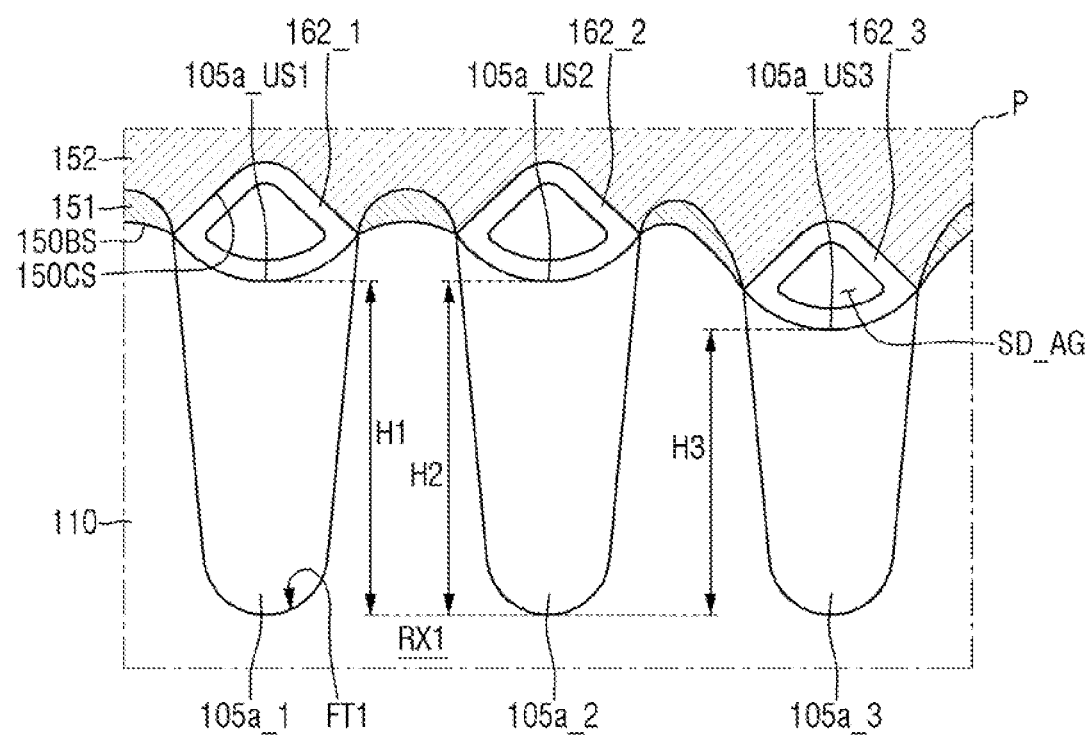
FIGS. 10, 11, 12, 13 and 14 are diagrams each illustrating a semiconductor device according to some embodiments of the present disclosure.
Figure 11:
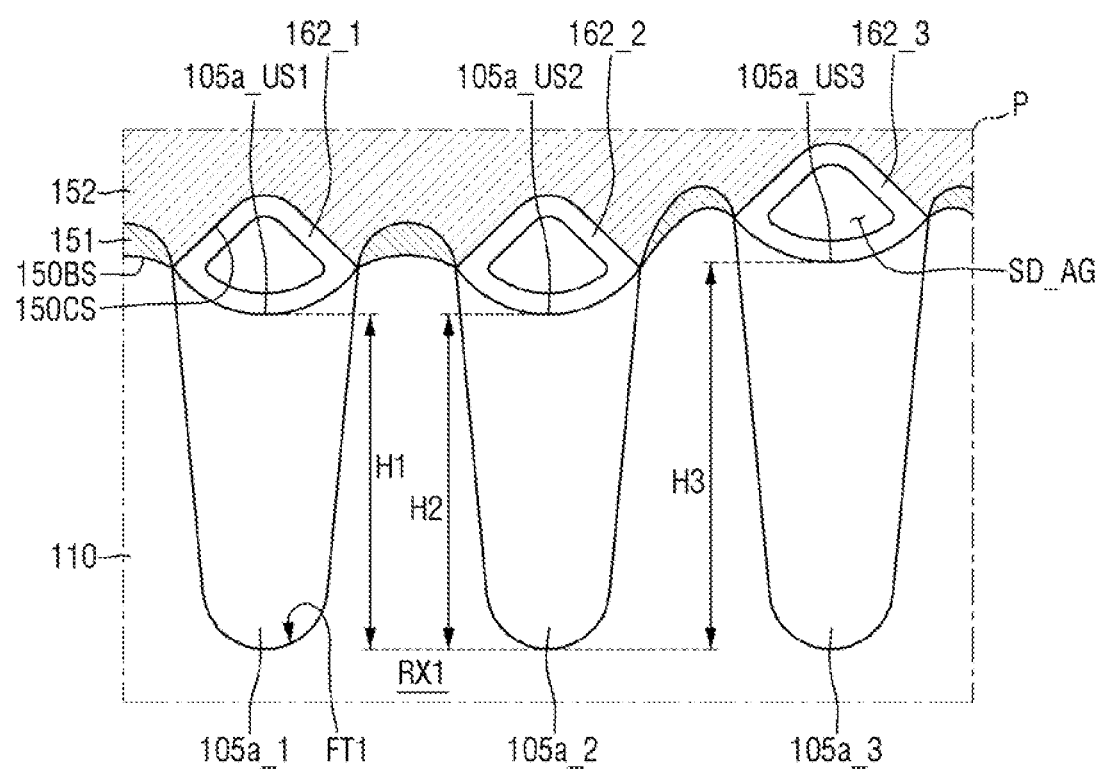

Referring to FIGS. 10 and 11, in the semiconductor device according to some embodiments of the present disclosure, the height H10 of the upper surface 105a_US1 of the first portion 150a_1 of the first inner field insulating layer 105a may be the same as the height H2 of the upper surface 105a_US2 of the second portion 105a_2 of the first inner field insulating layer 105a.

The height H2 of the upper surface 105a_US2 of the second portion 105a_2 of the first inner field insulating layer 105a may be different from the height H3 of the upper surface 105a_US3 of the third portion 105a_3 of the first inner field insulating layer 105a.

In FIG. 10, the height H2 of the upper surface 105a_US2 of the second portion 105a_2 of the first inner field insulating layer 105a is greater than the height H3 of the upper surface 105a_US3 of the third portion 105a_3 of the first inner field insulating layer 105a. In addition, the height H1 of the upper surface 105a_US1 of the first portion 105a_1 of the first inner field insulating layer 105a is greater than the height H3 of the upper surface 105a_US3 of the third portion 105a_3 of the first inner field insulating layer 105a.

In FIG. 11, the height H2 of the upper surface 105a_US2 of the second portion 105a_2 of the first inner field insulating layer 105a is smaller than the height H3 of the upper surface 105a_US3 of the third portion 105a_3 of the first inner field insulating layer 105a.

Figure 12:
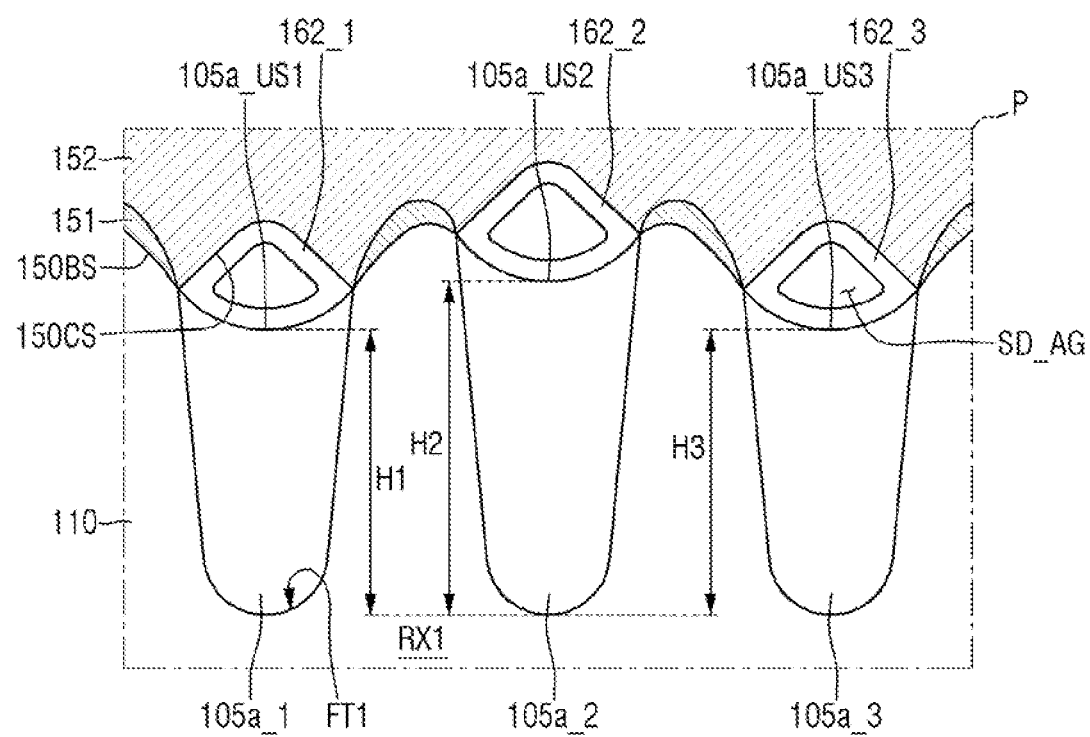
Figure 13:
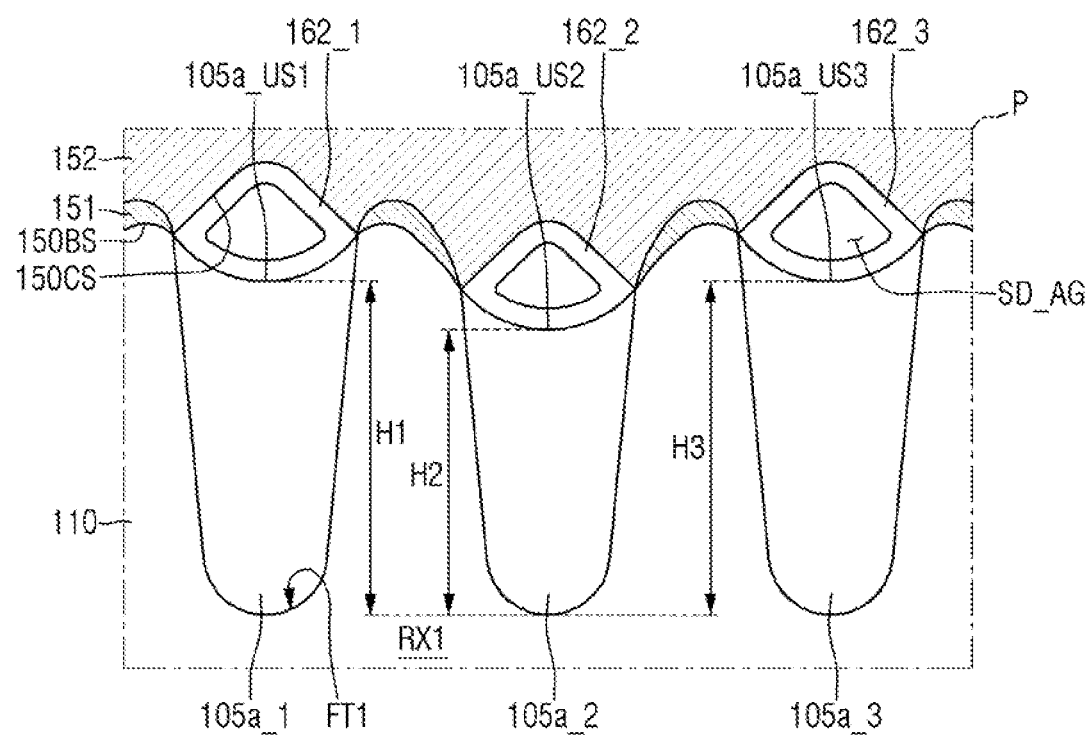
Figure 14:
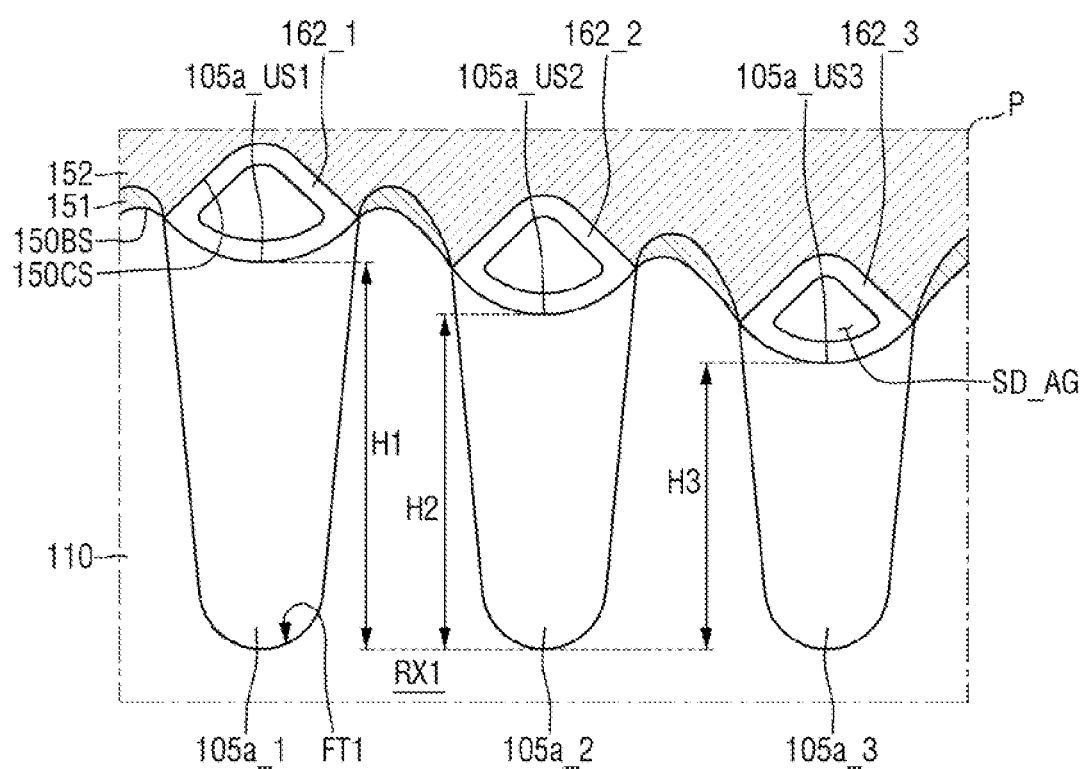

Referring to FIGS. 12 to 14, in the semiconductor device according to some embodiments of the present disclosure, the height H2 of the upper surface 105a_US2 of the second portion 105a_2 of the first inner field insulating layer 105a may be different from the height H3 of the upper surface 105a_US3 of the third portion 105a_3 of the first inner field insulating layer 105a.

The height H1 of the upper surface 105a_US1 of the first portion 105a_1 of the first inner field insulating layer 105a may be different from the height H2 of the upper surface 105a_US2 of the second portion 105a_2 of the first inner field insulating layer 105a.

In FIG. 12, the height H2 of the upper surface 105a_US2 of the second portion 105a_2 of the first inner field insulating layer 105a is greater than the height H3 of the upper surface 105a_US3 of the third portion 105a_3 of the first inner field insulating layer 105a.

The height H2 of the upper surface 105a_US2 of the second portion 105a_2 of the first inner field insulating layer 105a is greater than the height H1 of the upper surface 105a_US1 of the first portion 105a_1 of the first inner field insulating layer 105a.

In FIG. 13, the height H2 of the upper surface 105a_US2 of the second portion 105a_2 of the first inner field insulating layer 105a is smaller than the height H3 of the upper surface 105a_US3 of the third portion 105a_3 of the first inner field insulating layer 105a.

The height H2 of the upper surface 105a_US2 of the second portion 105a_2 of the first inner field insulating layer 105a is smaller than the height H1 of the upper surface 105a_US1 of the first portion 105a_1 of the first inner field insulating layer 105a.

In FIG. 14, the height H2 of the upper surface 105a_US2 of the second portion 105a_2 of the first inner field insulating layer 105 is greater than the height H3 of the upper surface 105a_US3 of the third portion 105a_3 of the first inner field insulating layer 105a.

The height H2 of the upper surface 105a_US2 of the second portion 105a_2 of the first inner field insulating layer 105 is smaller than the height H1 of the upper surface 105a_US1 of the first portion 105a_1 of the first inner field insulating layer 105a.

Unlike the illustrated example, when the number of the first fin-shaped patterns 110 is three, the heights of two upper surfaces 105a_US of the first inner field insulating layer 105a may be the same or different.

Figure 15:
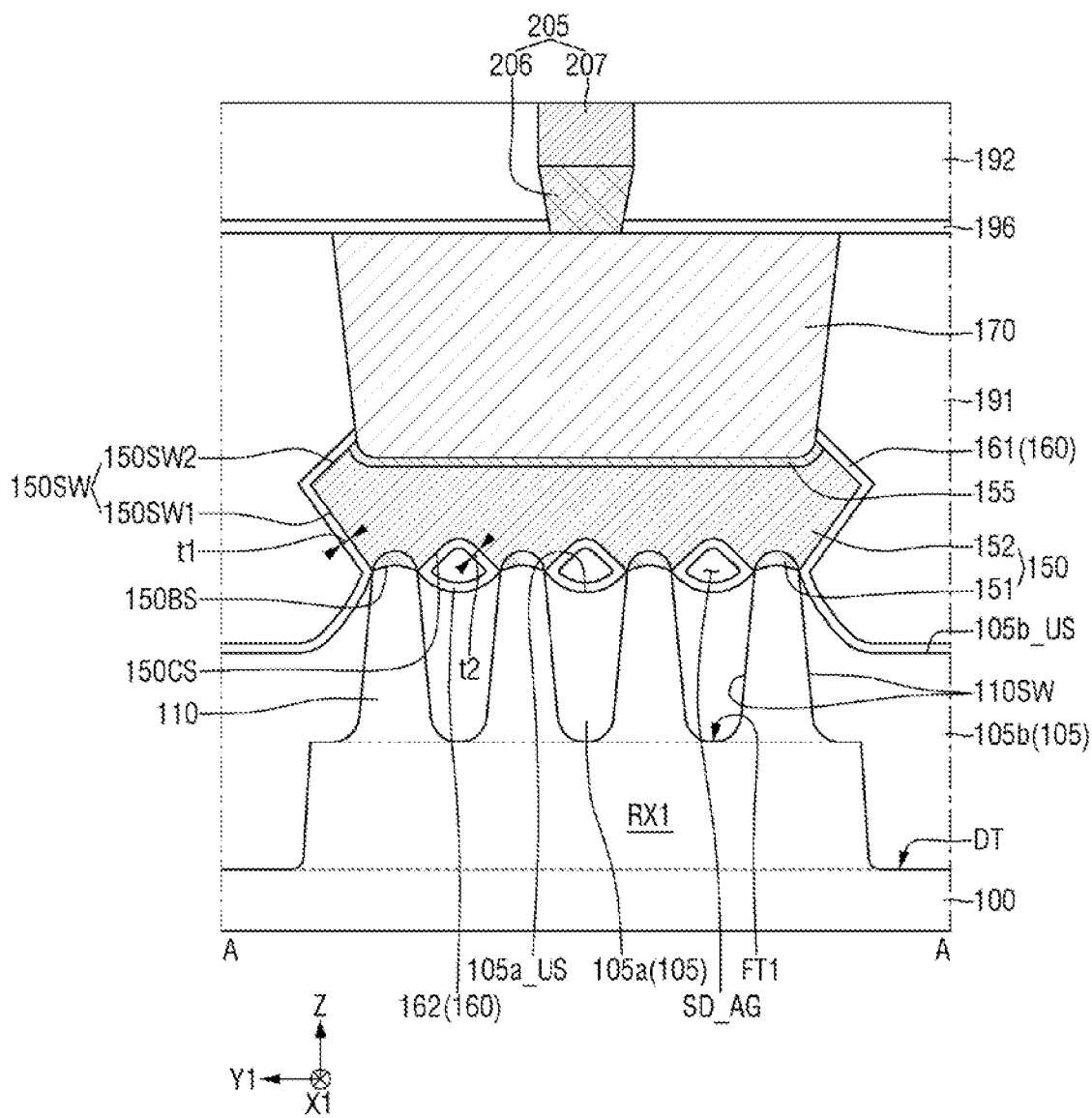
FIG. 15 is a diagram illustrating a semiconductor device according to some embodiments of the present disclosure.

FIG. 15 is a diagram illustrating a semiconductor device according to some embodiments of the present disclosure. For simplicity of description, the following description will focus on differences from the description with reference to FIGS. 1 to 9.

Referring to FIG. 15, in the semiconductor device according to some embodiments of the present disclosure, the thickness 12 of the first inner sealing insulating pattern 162 may be the same as the thickness t1 of the first outer sealing insulating pattern 161.

The thickness t1 of the first sealing insulating pattern 160 on the upper surface 105b US of the first outer field insulating layer 105b may be the same as the thickness 12 of the first sealing insulating pattern 160 on the upper surface 105a_US of the first inner field insulating layer 105a. The thickness t1 of the first sealing insulating pattern 160 on the outer sidewall 150SW of the first source/drain pattern 150 may be the same as the thickness t2 of the first sealing insulating pattern 160 on the connection surface 150CS of the first source/drain pattern 150.

For example, as shown in FIG. 6, the first sealing insulating pattern 160 may fill a space between the second portion 150_2 of the first source/drain pattern 150 and the first gate spacer 140.

As another example, the first sealing insulating pattern 160 may fill a part of the space between the second portion 150_2 of the first source/drain pattern 150 and the first gate spacer 140. A part of the first interlayer insulating layer 191 may be recessed into the space between the second portion 150_2 of the first source/drain pattern 150 and the first gate spacer 140. Alternatively, the sealing air gap SD_AG may extend between the second portion 150_2 of the first source/drain pattern 150 and the first gate spacer 140.

Figure 16:
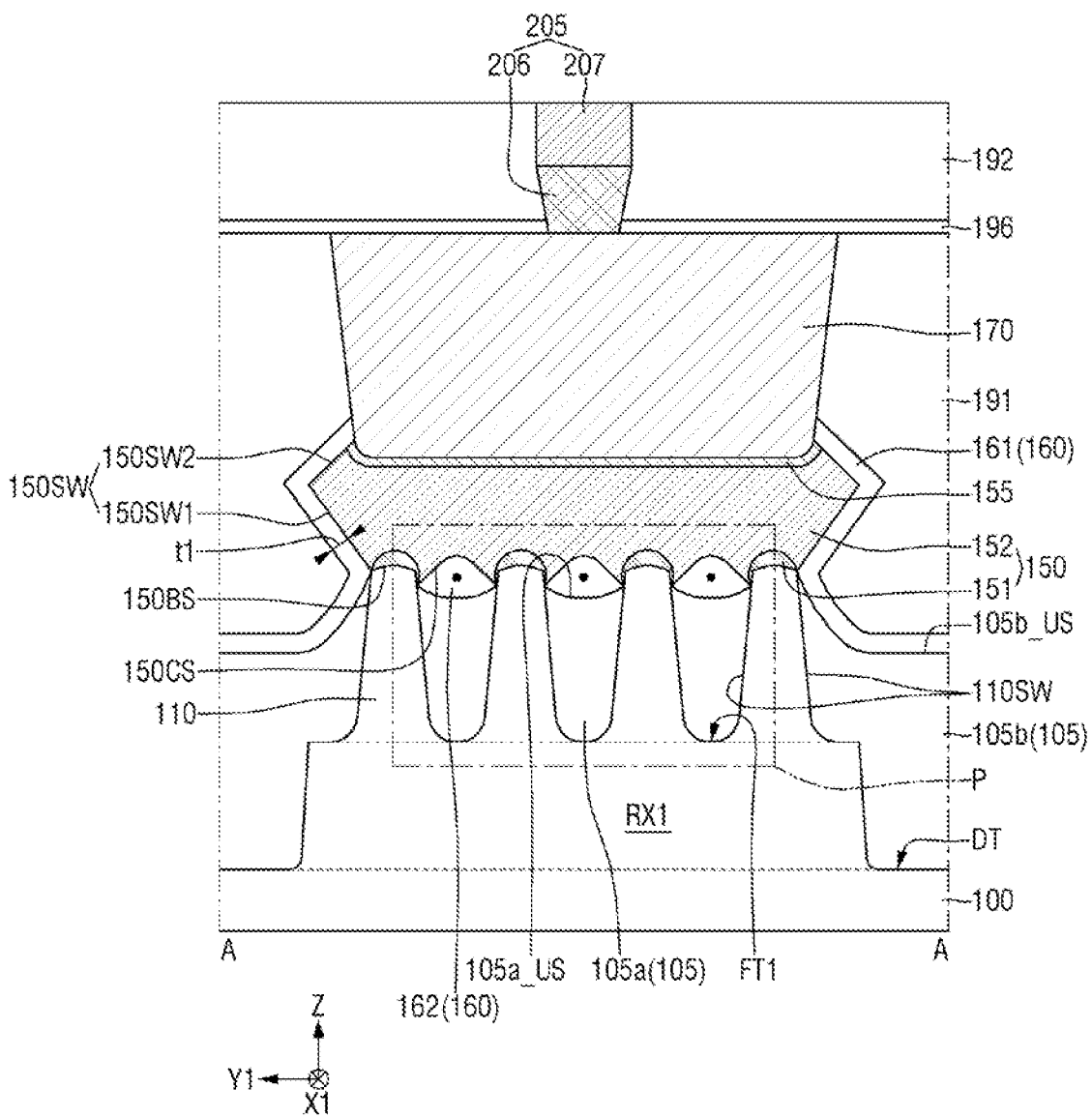
FIGS. 16 and 17 are diagrams illustrating a semiconductor device according to some embodiments of the present disclosure.
Figure 17:
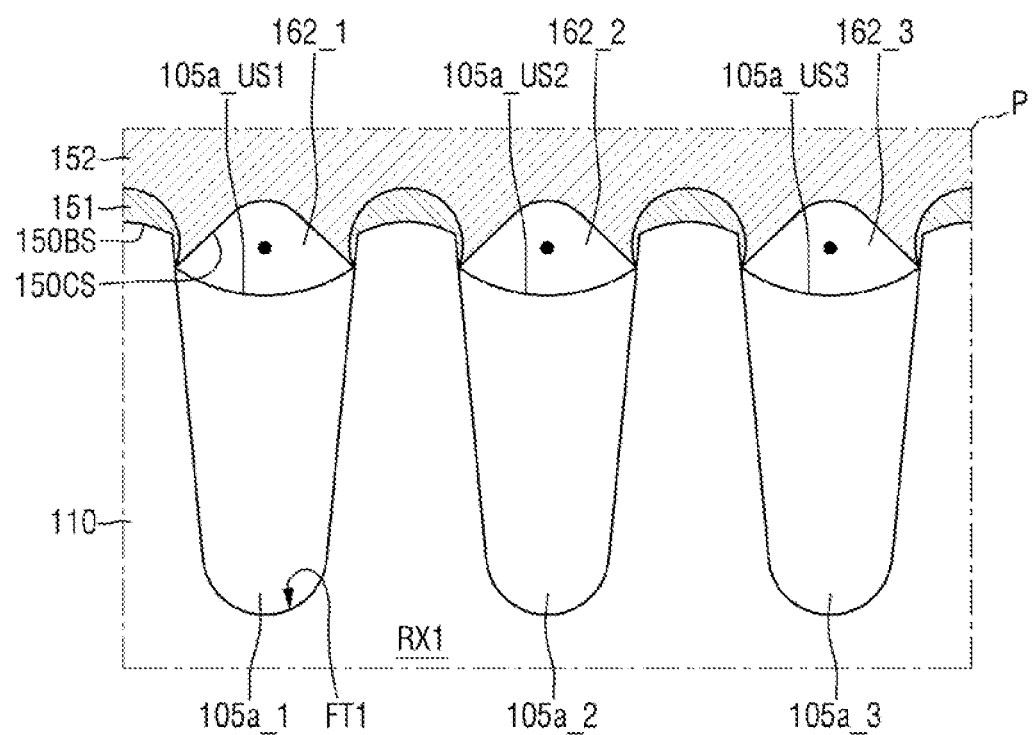

FIGS. 16 and 17 are diagrams illustrating a semiconductor device according to some embodiments of the present disclosure. For simplicity of description, the following description will focus on differences from the description with reference to FIGS. 1 to 9.

For reference, FIG. 17 is an enlarged view of part P of FIG. 16.

Referring to FIGS. 16 and 17, in the semiconductor device according to some embodiments of the present disclosure, the first inner sealing insulating pattern 162 does not include the sealing air gap SD_AG (see FIGS. 2 and 3) disposed therein.

Each of the first sub-sealing insulating pattern 162_1, the second sub-sealing insulating pattern 162_2, and the third sub-sealing insulating pattern 162_3 does not include the sealing air gap SD_AG.

For example, each of the first sub-sealing insulating pattern 162_1, the second sub-sealing insulating pattern 162_2, and the third sub-sealing insulating pattern 162_3 may be disposed on the connection surface 150CS of the first source/drain pattern 150 and the upper surfaces 105a_US1, 105a_US2, and 105a_US3 of the first inner field insulating layer 105a. In other words, each of the first sub-sealing insulating pattern 162_1, the second sub-sealing insulating pattern 162_2, and the third sub-sealing insulating pattern 162_3 may extend along the connection surface 150CS of the first source/drain pattern 150 and the upper surfaces 105a_US1, 105a_US2, and 105a_US3 of the first inner field insulating layer 105a.

As shown in FIG. 17, in a cross-sectional view taken in the second direction Y1, the first sub-sealing insulating pattern 162_1, the second sub-sealing insulating pattern 162_2, and the third sub-sealing insulating pattern 162_3 may each include a dot-like seam structure. While the first sealing insulating pattern 160 fills a space between the connection surface 150CS of the first source/drain pattern 150 and the upper surfaces 105a_US1, 105a_US2, and 105a_US3 of the first inner field insulating layer 105a, the dot-like seam structure may be formed.

Unlike the illustrated example, at least one of the first sub-sealing insulating pattern 162_1, the second sub-sealing insulating pattern 162_2, or the third sub-sealing insulating pattern 162_3 may not include the dot-like seam structure.

Figure 18:
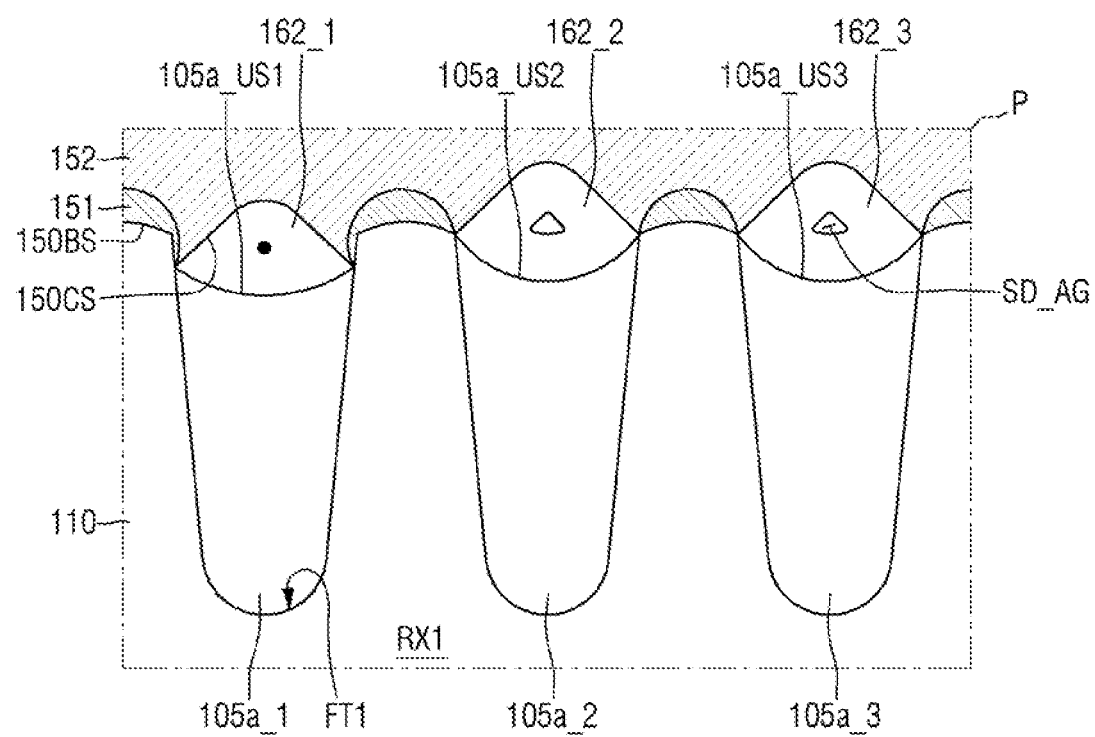
FIG. 18 is a diagram illustrating a semiconductor device according to some embodiments of the present disclosure.

FIG. 18 is a diagram illustrating a semiconductor device according to some embodiments of the present disclosure. For simplicity of description, the following will focus on differences from the description with reference to FIGS. 1 to 9, 16 and 17. For reference, FIG. 18 is an enlarged view of part P of FIG. 16.

Referring to FIGS. 16 and 18, in the semiconductor device according to some embodiments of the present disclosure, in the first inner sealing insulating pattern 162 disposed between the connection surface 150CS of the first source/drain pattern 150 and the upper surface 105a_US of the first inner field insulating layer 105a, a part of the first inner sealing insulating pattern 162 may include the sealing air gap SD_AG, and the other part of the first inner sealing insulating pattern 162 may not include the sealing air gap SD_AG. In other words, a first portion of the first inner sealing insulating pattern 162 may include the sealing air gap SD_AG, and a second portion of the first inner sealing insulating pattern 162 may not include the sealing air gap SD_AG.

At least one of the first sub-sealing insulating pattern 162_1, the second sub-sealing insulating pattern 162_2, or the third sub-sealing insulating pattern 162_3 may include the sealing air gap SD_AG, and the rest thereof may not include the sealing air gap SD_AG.

For example, the second sub-sealing insulating pattern 162_2 and the third sub-sealing insulating pattern 162_3 may include the sealing air gap SD_AG. The first sub-sealing insulating pattern 162_1 may not include the sealing air gap SD_AG. However, the above description is merely an example and the present disclosure is not limited thereto.

Unlike the illustrated example, one of the second sub-sealing insulating pattern 162_2 and the third sub-sealing insulating pattern 162_3 may include the sealing air gap SD_AG, and the first sub-sealing insulating pattern 162_1 may include the sealing air gap SD_AG.

In addition, unlike the illustrated example, one of the first sub-sealing insulating pattern 162_1, the second sub-sealing insulating pattern 162_2, and the third sub-sealing insulating pattern 162_3 may include the sealing air gap SD_AG, the other two may not include the sealing air gap SD_AG.

Figure 19:
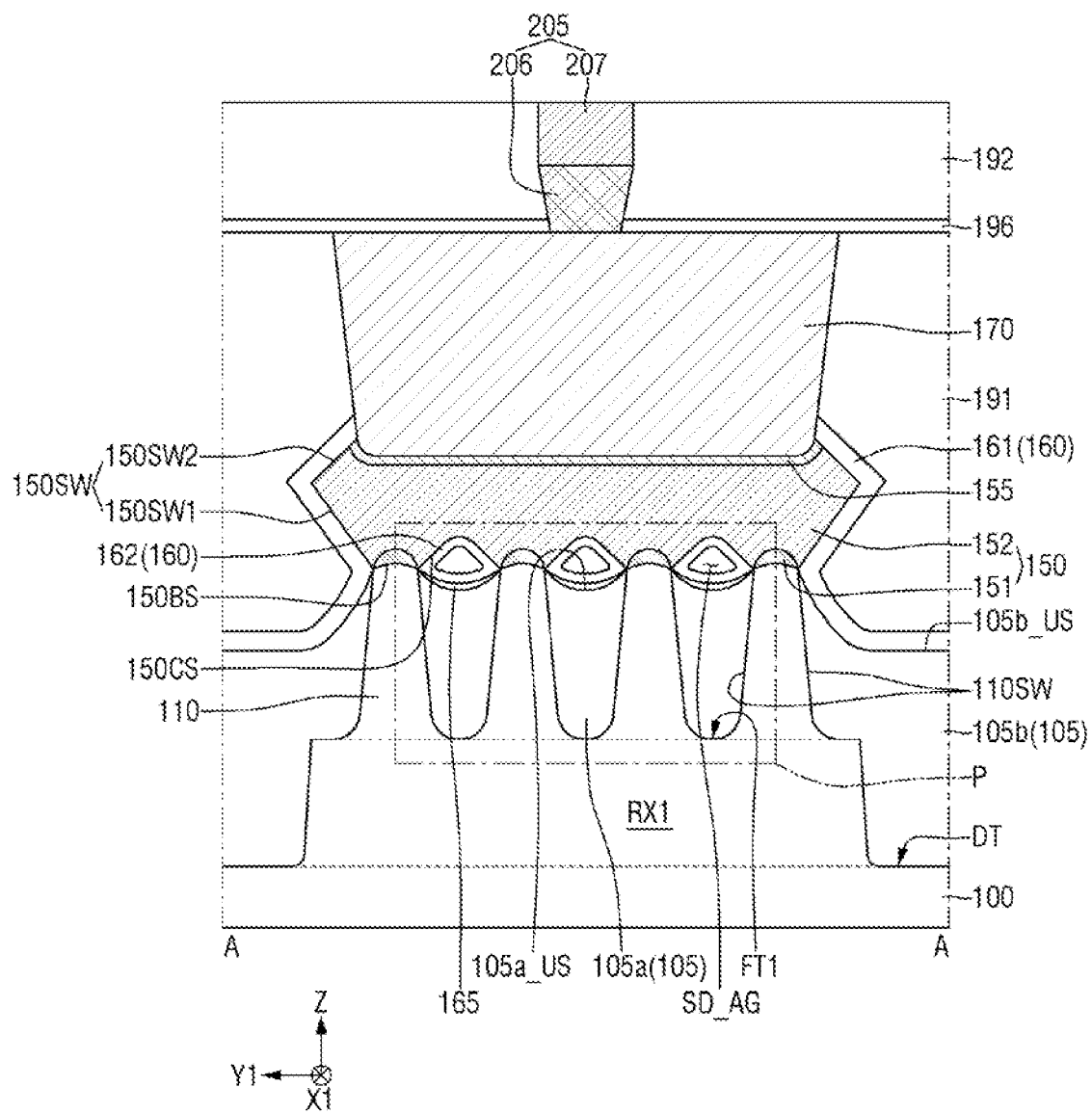
FIGS. 19, 20 and 21 are diagrams illustrating a semiconductor device according to some embodiments of the present disclosure.
Figure 20:
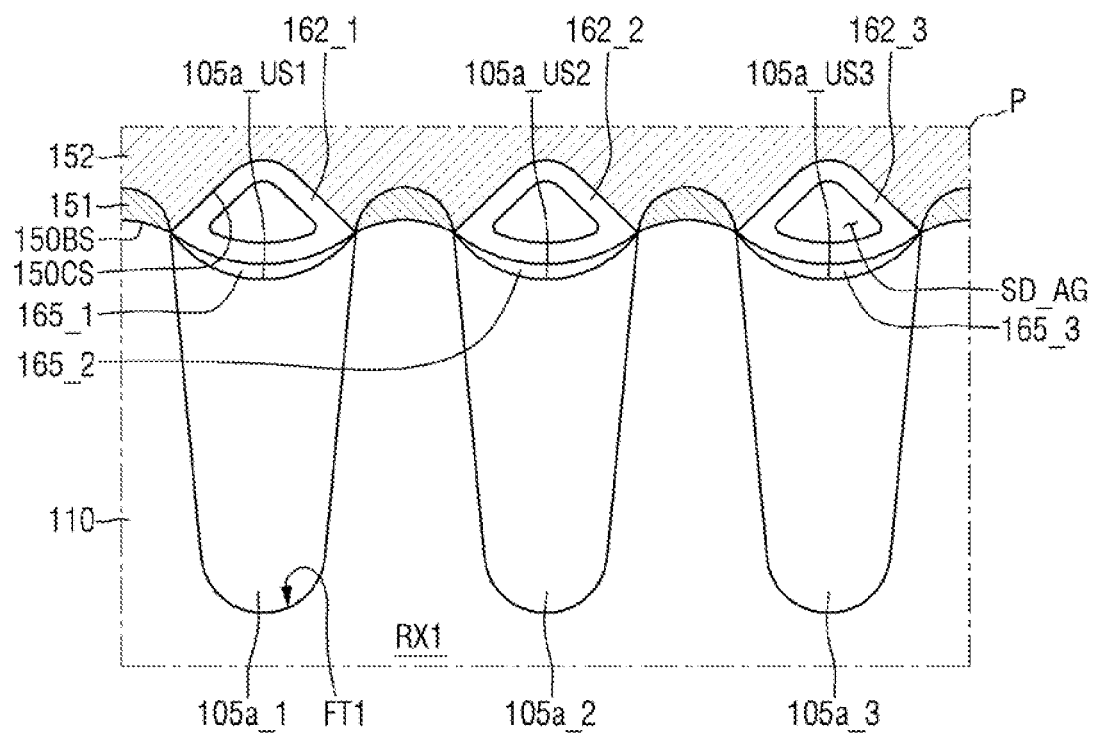
Figure 21:
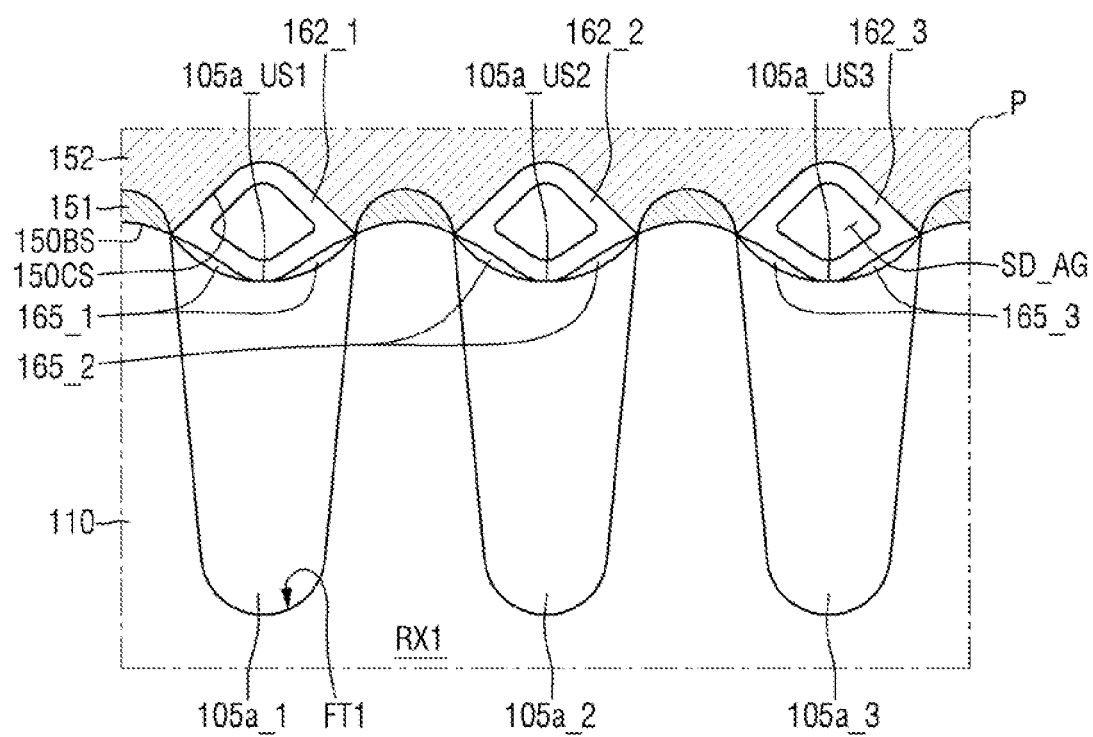

FIGS. 19 to 21 are diagrams illustrating a semiconductor device according to some embodiments of the present disclosure. For simplicity of description, the following description will focus on differences from the description with reference to FIGS. 1 to 9. For reference, FIGS. 20 and 21 are enlarged views of part P of FIG. 19.

Referring to FIGS. 19 to 21, the semiconductor device according to some embodiments of the present disclosure may further include an insertion sealing pattern 165 disposed between the first inner sealing insulating pattern 162 and the first inner field insulating layer 105a.

The insertion sealing pattern 165 may be disposed on the upper surface 105a_US of the first inner field insulating layer 105a. The insertion sealing pattern 165 may include, for example, at least one of silicon nitride (SiN), silicon oxynitride (SiON), silicon oxide (SiO$_2$), silicon oxynitride (SiOCN), silicon boronitride (SiBN), silicon oxyboronitride (SiOBN), silicon oxycarbide (SIOC) or a combination thereof.

The insertion sealing pattern 165 may include a first sub-insertion sealing pattern 165_1, a second sub-insertion sealing pattern 165_2, and a third sub-insertion sealing pattern 165_3.

The first sub-insertion sealing pattern 165_1 is disposed between the first sub-sealing insulating pattern 162_1 and the first portion 105a_1 of the first inner field insulating layer 105a. The second sub-insertion sealing pattern 165_2 is disposed between the second sub-sealing insulating pattern 162_2 and the second portion 105a_2 of the first inner field insulating layer 105a. The third sub-insertion sealing pattern 165_3 is disposed between the third sub-sealing insulating pattern 162_3 and the third portion 105a_3 of the first inner field insulating layer 105a.

In FIG. 20, the first sub-insertion sealing pattern 165_1 may extend entirely along a boundary surface between the first sub-sealing insulating pattern 162_1 and the first portion 105a_1 of the first inner field insulating layer 105a. In cross-sectional view, the first sub-insertion sealing pattern 165_1 may entirely cover the upper surface 105a_US1 of the first portion 105a_1 of the first inner field insulating layer 105a.

The second sub-insertion sealing pattern 165_2 may extend entirely along a boundary surface between the second sub-sealing insulating pattern 162_2 and the second portion 105a_2 of the first inner field insulating layer 105a. The third sub-insertion sealing pattern 165_3 may extend entirely along a boundary surface between the third sub-sealing insulating pattern 162_3 and the third portion 105a_3 of the first inner field insulating layer 105a. In this case, the second sub-insertion sealing pattern 165_2 may entirely cover the upper surface 105a_US2 of the second portion 105a_2 of the first inner field insulating layer 105a, and the third sub-insertion sealing pattern 165_3 may entirely cover the upper surface 105a_US3 of the third portion 105a_3 of the first inner field insulating layer 105a.

In FIG. 21, the first sub-insertion sealing pattern 165_1 may include a first portion and a second portion disposed on the upper surface 105a_US1 of the first portion 105a_1 of the first inner field insulating layer 105a. The first portion of the first sub-insertion sealing pattern 165_1 may be spaced apart from the second portion of the first sub-insertion sealing pattern 165_1 in the second direction Y1. In cross-sectional view, the first sub-insertion sealing pattern 165_1 may cover a part of the upper surface 105a_US1 of the first portion 105a_1 of the first inner field insulating layer 105a.

The second sub-insertion sealing pattern 165_2 may include a first portion and a second portion disposed on the upper surface 105a_US2 of the second portion 105a_2 of the first inner field insulating layer 105a. The third sub-insertion sealing pattern 165_3 may include a first portion and a second portion disposed on the upper surface 105a_US3 of the third portion 105a_3 of the first inner field insulating layer 105a.

Although it is illustrated that all of the plurality of sub-sealing insulating patterns of the first inner sealing insulating pattern 162 disposed between the connection surface 150CS of the first source/drain pattern 150 and the upper surface 105a_US of the first inner field insulating layer 105a include the sealing air gap SD_AG, this is merely for simplicity of description, and the present disclosure is not limited thereto.

Unlike the illustrated example, at least one of the first sub-sealing insulating pattern 162_1, the second sub-sealing insulating pattern 162_2, or the third sub-sealing insulating pattern 162_3 may include the sealing air gap SD_AG, and the rest thereof may not include the sealing air gap SD_AG.

Figure 22:
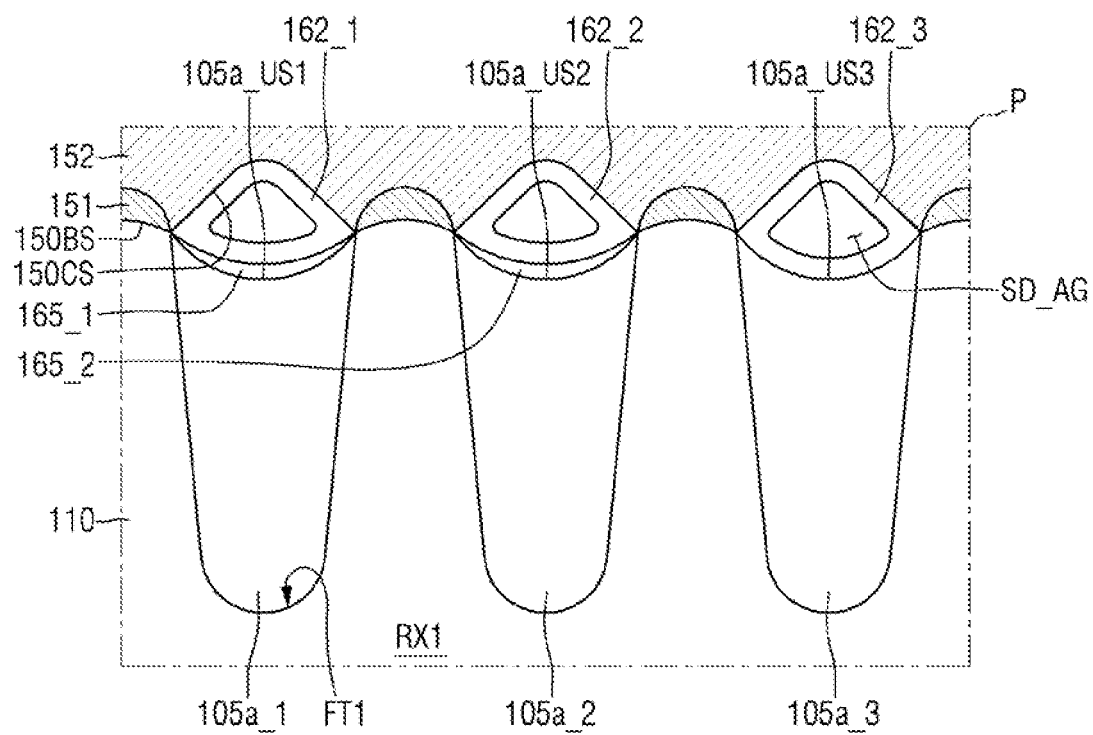
FIGS. 22, 23 and 24 are diagrams each illustrating a semiconductor device according to some embodiments of the present disclosure.
Figure 23:
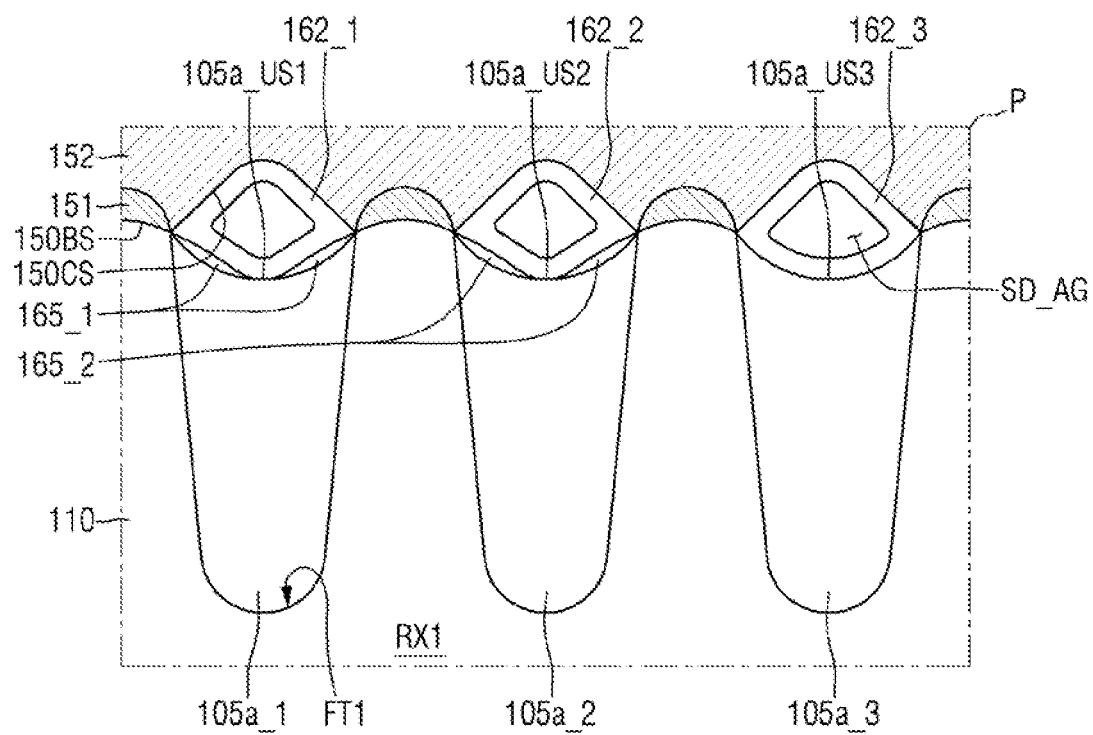
Figure 24:
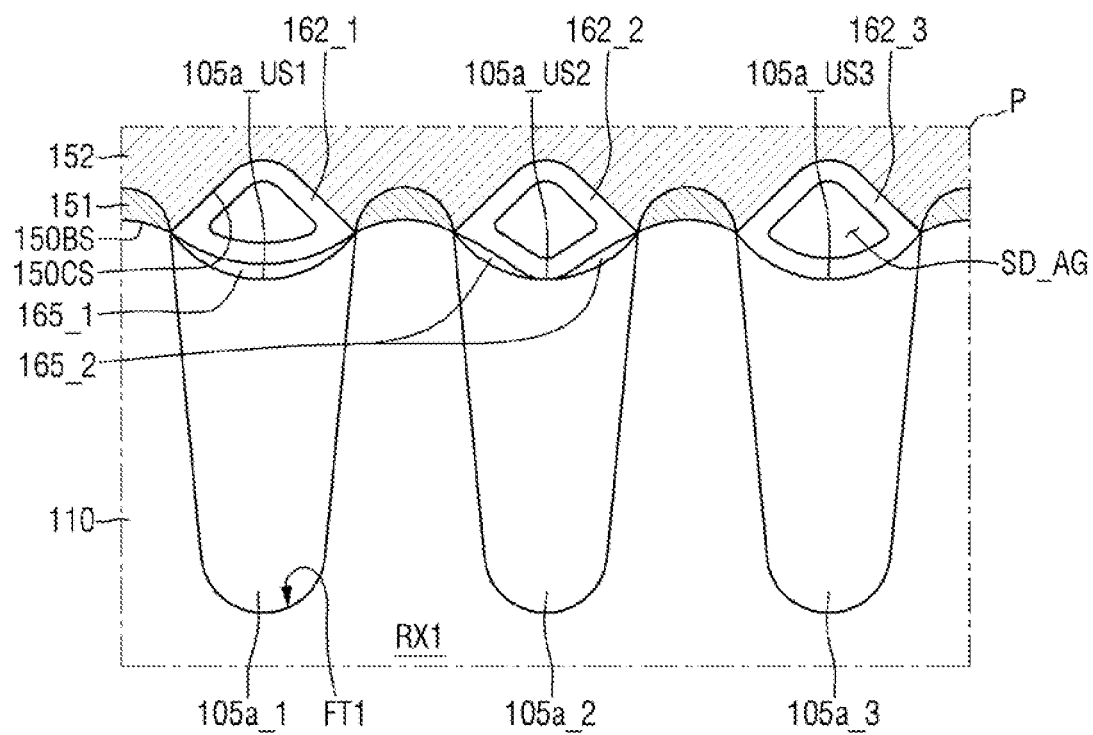

FIGS. 22 to 24 are diagrams each illustrating a semiconductor device according to some embodiments of the present disclosure. For simplicity of description, the following description will focus on differences from the description with reference to FIGS. 19 to 21. For reference, FIGS. 22 to 24 are enlarged views of part P of FIG. 19.

Referring to FIGS. 22 to 24, in the semiconductor device according to some embodiments of the present disclosure, a plurality of spaces may be provided between the connection surface 150CS of the first source/drain pattern 150 and the upper surface 105a_US of the first inner field insulating layer 105a. The insertion sealing pattern 165 may be disposed in a part of the plurality of spaces, and may not be disposed in the other part thereof.

For example, the first sub-insertion sealing pattern 165_1 is disposed between the first sub-sealing insulating pattern 162_1 and the first portion 105a_1 of the first inner field insulating layer 105a. The second sub-insertion sealing pattern 165_2 is disposed between the second sub-sealing insulating pattern 162_2 and the second portion 105a_2 of the first inner field insulating layer 105a. The insertion sealing pattern 165 is not disposed between the third sub-sealing insulating pattern 162_3 and the third portion 105a_3 of the first inner field insulating layer 105a.

In FIG. 22, the first sub-insertion sealing pattern 165_1 may extend entirely along a boundary surface between the first sub-sealing insulating pattern 162_1 and the first portion 105a_1 of the first inner field insulating layer 105a. The second sub-insertion sealing pattern 165_2 may extend entirely along a boundary surface between the second sub-sealing insulating pattern 162_2 and the second portion 105a_2 of the first inner field insulating layer 105a.

In FIG. 23, the first sub-insertion sealing pattern 165_1 may include a first portion and a second portion disposed on the upper surface 105a_US1 of the first portion 105a_1 of the first inner field insulating layer 105a. The first portion of the first sub-insertion sealing pattern 165_1 may be spaced apart from the second portion of the first sub-insertion sealing pattern 165_1 in the second direction Y1. The second sub-insertion sealing pattern 165_2 may include a first portion and a second portion disposed on the upper surface 105a_US2 of the second portion 105a_2 of the first inner field insulating Jayer 105a.

In FIG. 24, the first sub-insertion sealing pattern 165_1 may extend entirely along a boundary surface between the first sub-sealing insulating pattern 162_1 and the first portion 105a_1 of the first inner field insulating layer 105a. The second sub-insertion sealing pattern 165_2 may include a first portion and a second portion disposed on the upper surface 105a_US2 of the second portion 105a_2 of the first inner field insulating layer 105a.

Unlike the illustrated example, for example, the insertion sealing pattern 165 may not be disposed between the first sub-sealing insulating pattern 162_1 and the first portion 105a_1 of the first inner field insulating layer 105a. As another example, the insertion sealing pattern 165 may not be disposed between the second sub-sealing insulating pattern 162_2 and the second portion 105a_2 of the first inner field insulating layer 105a.

In addition, unlike the illustrated example, the first sub-insertion sealing pattern 165_1 may include a first portion and a second portion disposed on the upper surface 105a_US1 of the first portion 105a_1 of the first inner field insulating layer 105a. The second sub-insertion sealing pattern 165_2 may extend entirely along a boundary surface between the second sub-sealing insulating pattern 162_2 and the second portion 105a_2 of the first inner field insulating layer 105a.

Figure 25:
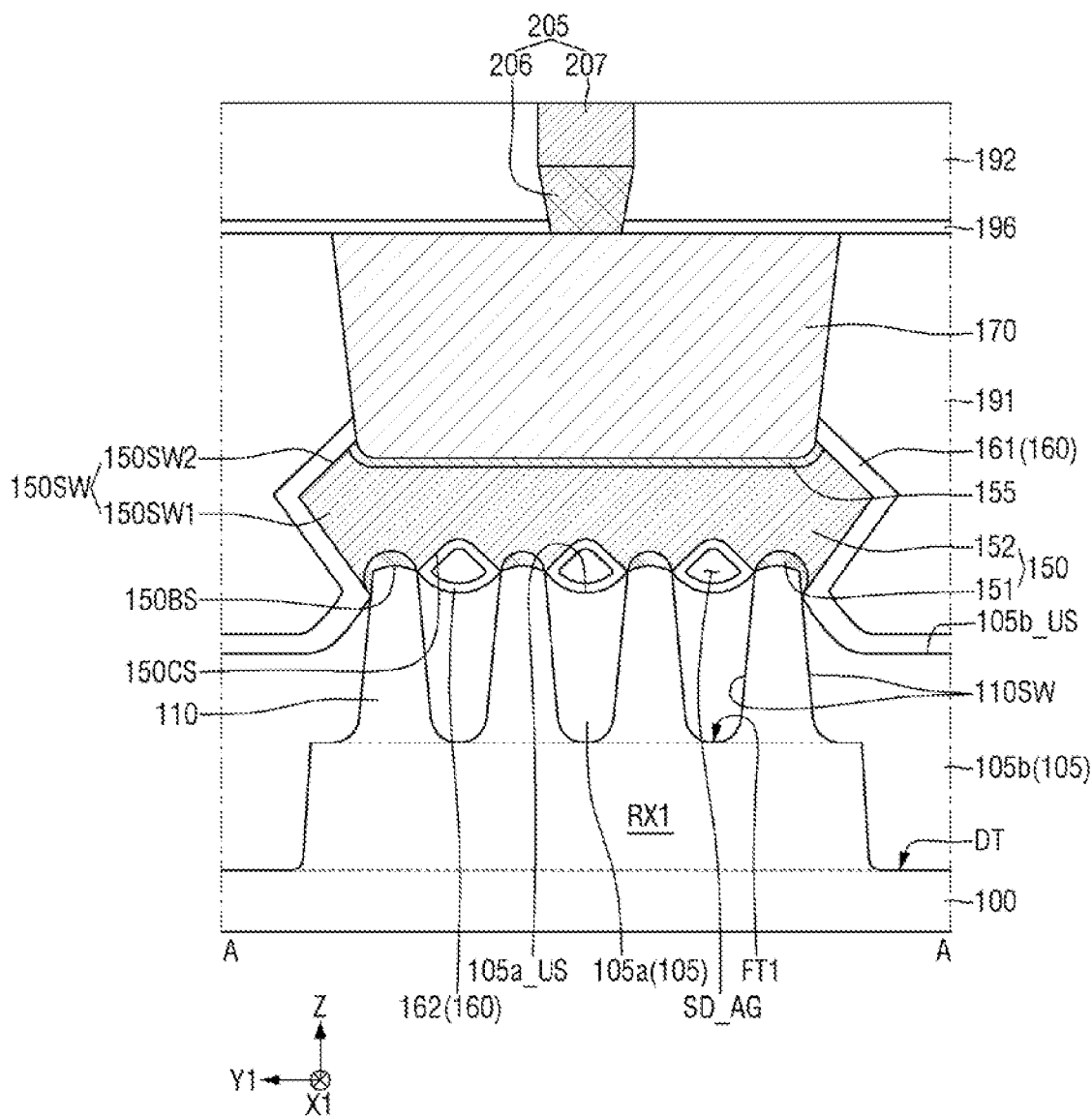
FIG. 25 is a diagram illustrating a semiconductor device according to some embodiments of the present disclosure.

FIG. 25 is a diagram illustrating a semiconductor device according to some embodiments of the present disclosure. For simplicity of description, the following description will focus on differences from the description with reference to FIGS. 1 to 9.

Referring to FIG. 25, in the semiconductor device according to some embodiments of the present disclosure, a part of the sidewall 110SW of the first fin-shaped pattern 110 disposed at the outermost portion of the first active region RX1 may be exposed from the first outer field insulating layer 105b.

The first outer field insulating layer 105b may not entirely cover the sidewall 110SW of the first fin-shaped pattern 110 disposed at the outermost portion of the first active region RX1. The first lower epitaxial region 151 covers the sidewall 110SW of the first fin-shaped pattern 110 exposed from the first outer field insulating layer 105b.

Figure 26:
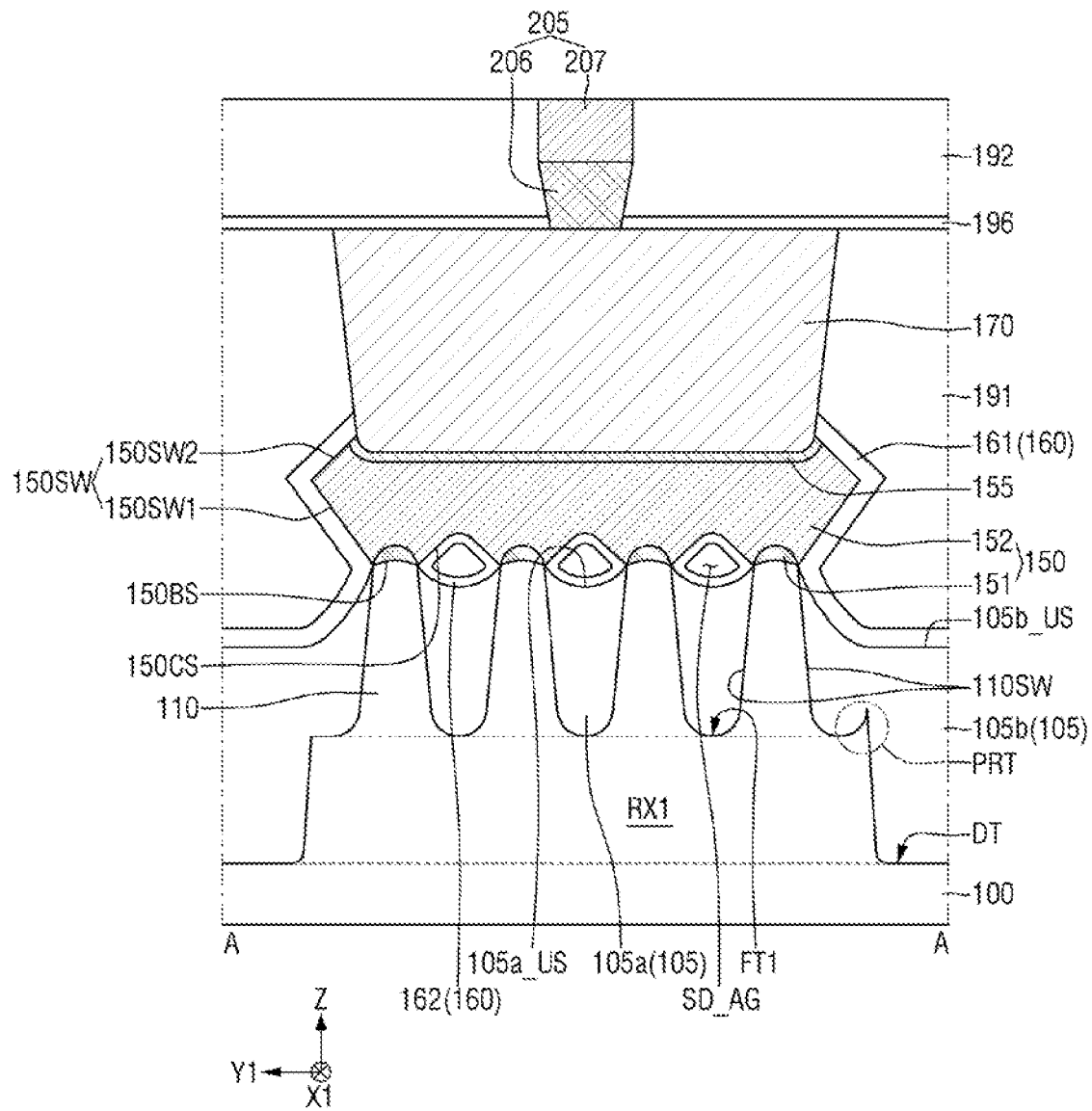
FIGS. 26 and 27 are diagrams each illustrating a semiconductor device according to some embodiments of the present disclosure.
Figure 27:
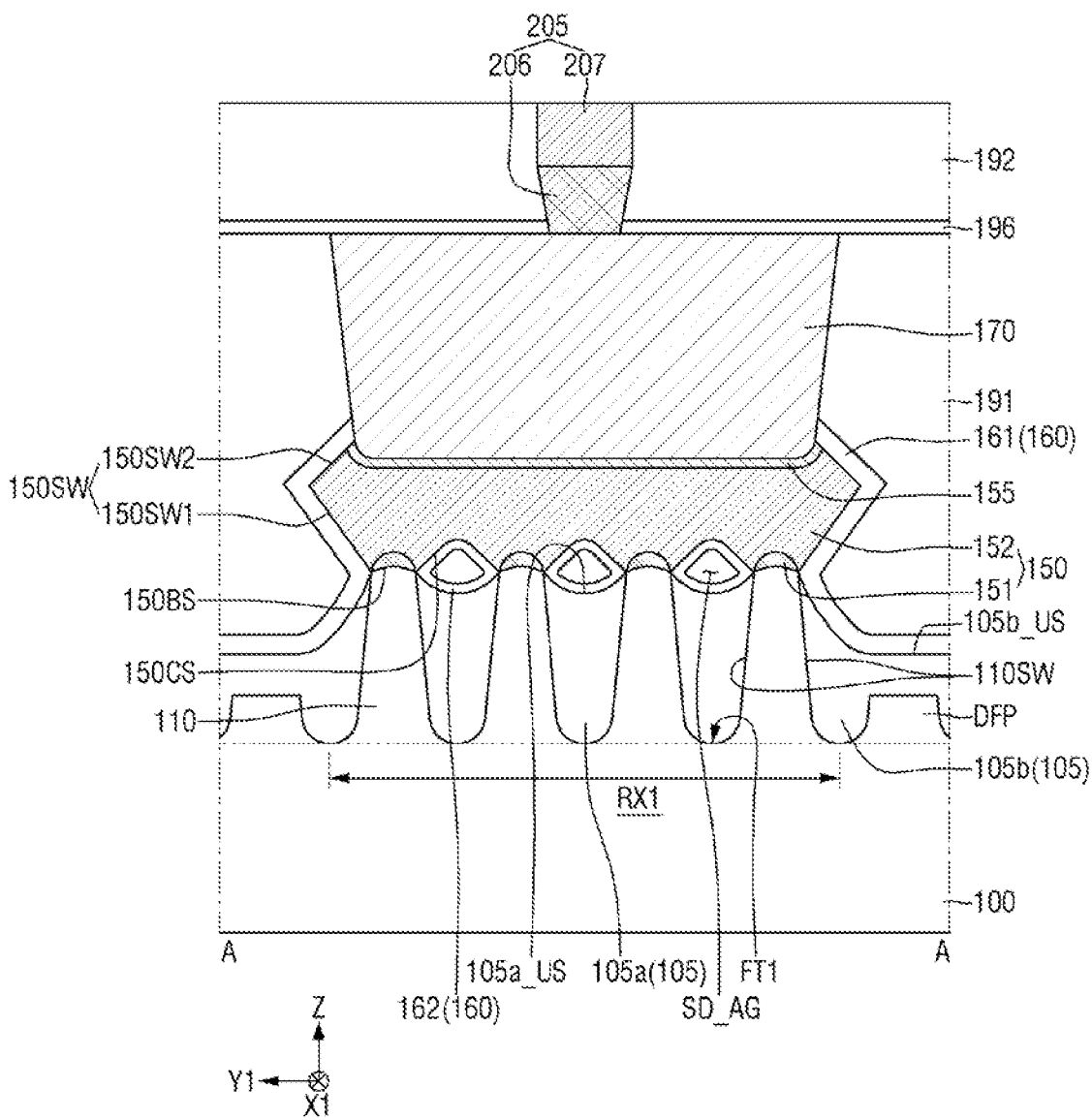

FIGS. 26 and 27 are diagrams each illustrating a semiconductor device according to some embodiments of the present disclosure. For simplicity of description, the following description will focus on differences from the description with reference to FIGS. 1 to 9.

Referring to FIG. 26, the semiconductor device according to some embodiments of the present disclosure may further include a protrusion structure PRT disposed along the boundary of the first active region RX1.

The protrusion structure PRT may be disposed at the boundary of the first active region RX1 extending in the first direction X1. A first sidewall of the protrusion structure PRT may be defined by the first fin trench FT1, and a second sidewall of the protrusion structure PRT may be defined by the deep trench DT. The protrusion structure PRT may be elongated in the first direction X1.

The protrusion structure PRT is covered with the first field insulating layer 105. For example, the protrusion structure PRT is covered with the first outer field insulating layer 105b. The protrusion structure PRT may include the same semiconductor material as the first fin-shaped pattern 110.

Although the protrusion structure PRT is illustrated as being disposed along one of two boundaries of the first active region RX1 extending in the first direction X1, the present disclosure is not limited thereto. Unlike the illustrated example, the protrusion structure PRT may also be disposed along two boundaries of the first active region RX1 extending in the first direction X1.

The protrusion structure PRT may also be disposed at the edge of the second active region RX2.

Referring to FIG. 27, the semiconductor device according to some embodiments of the present disclosure may further include dummy protrusion patterns DFP disposed around the plurality of first fin-shaped patterns 110.

The deep trench DT (see FIG. 2) is not formed around the plurality of first fin-shaped patterns 110. The first active region RX1 may be provided between the dummy protrusion patterns DFP.

The dummy protrusion patterns DFP may also be disposed around the plurality of second fin-shaped patterns 210. The second active region RX2 (see FIG. 7) may be provided between the dummy protrusion patterns DFP.

The dummy protrusion pattern DFP may be elongated in the first direction X1. The upper surface of the dummy protrusion pattern DFP is covered with the first field insulating layer 105. For example, the upper surface of the dummy protrusion pattern DFP is covered with the first outer field insulating layer 105b. The dummy protrusion pattern DFP may include a semiconductor material.

Figure 28:
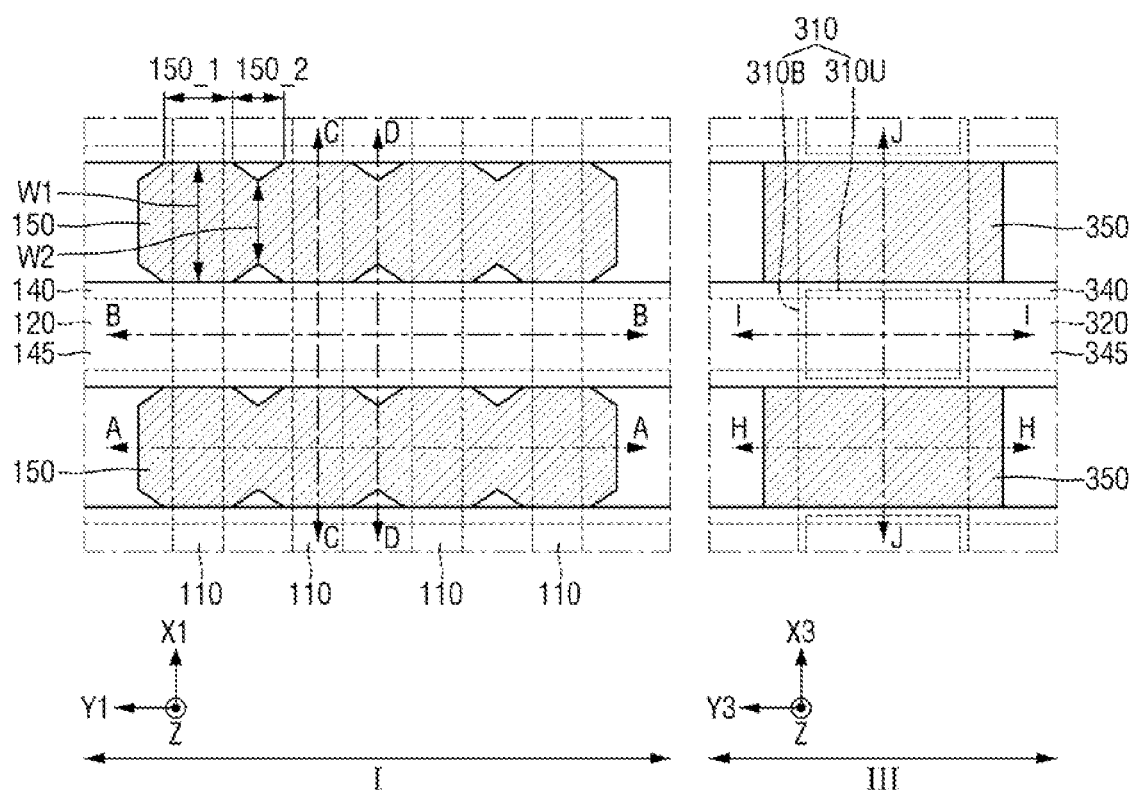
FIG. 28 is a layout diagram illustrating a semiconductor device according to some embodiments of the present disclosure.
Figure 29:
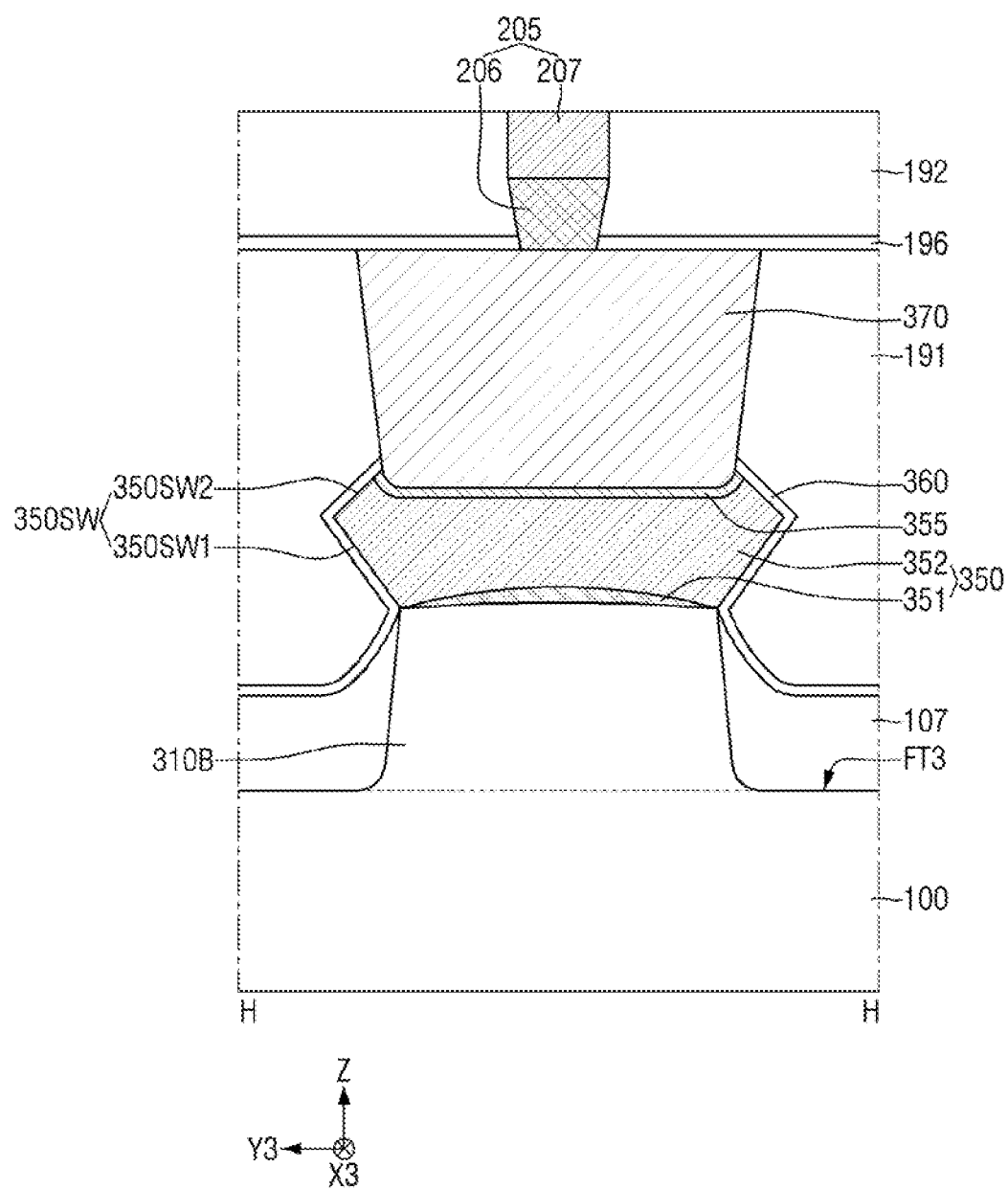
FIGS. 29, 30 and 31 are cross-sectional views taken along lines H-H, I-I and J-J of FIG. 28, respectively.
Figure 30:
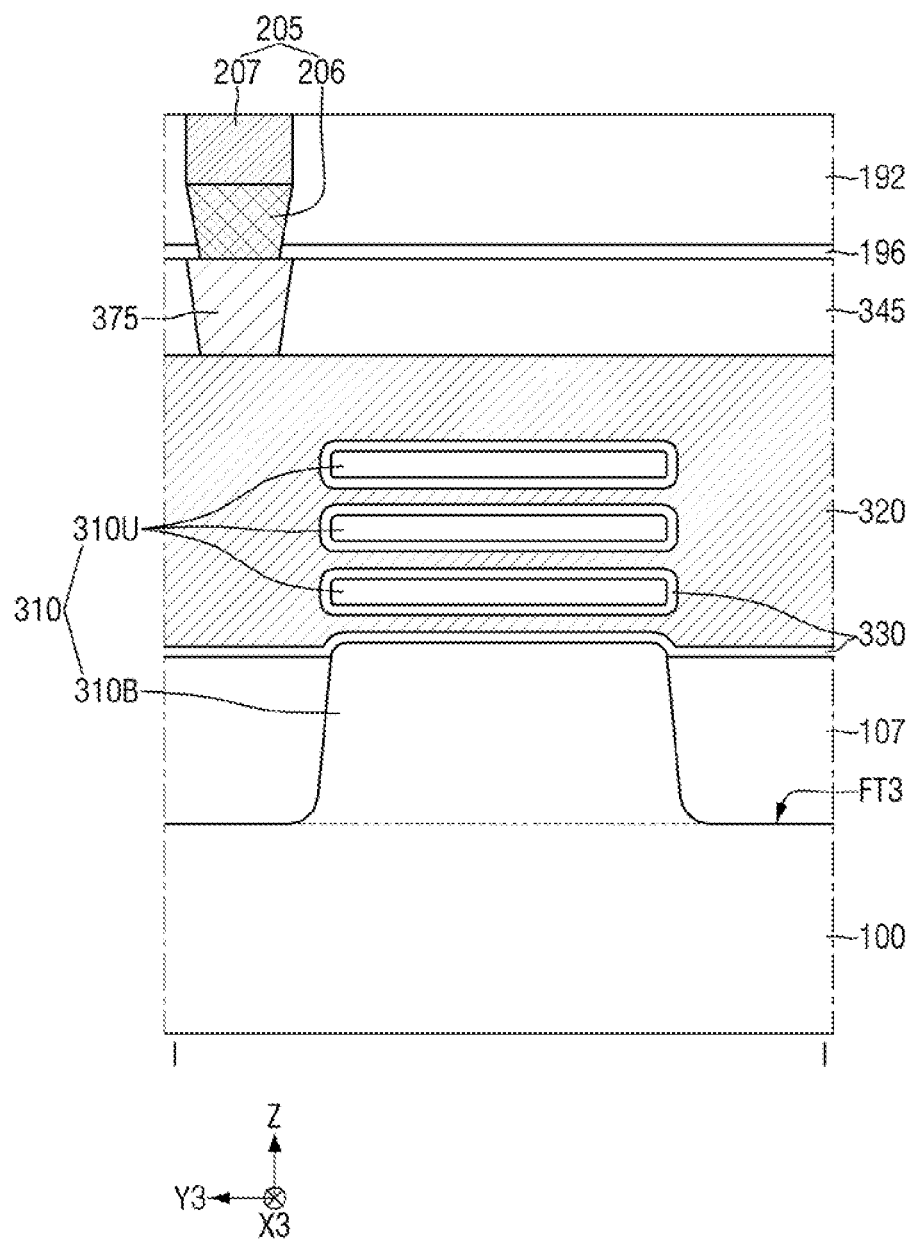
Figure 31:
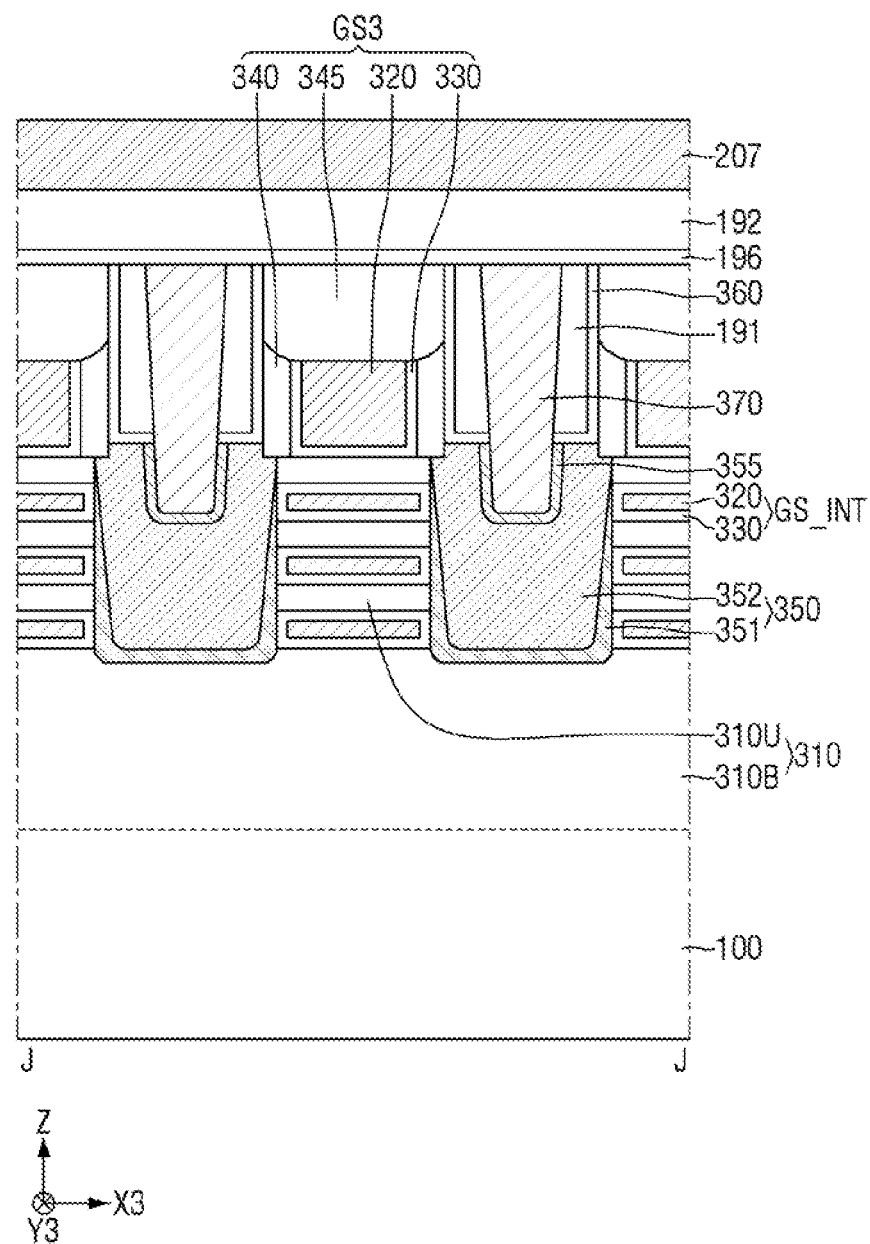

FIG. 28 is an example layout diagram illustrating a semiconductor device according to some embodiments of the present disclosure. FIGS. 29 to 31 are cross-sectional views taken along lines H-H, I-I and J-J of FIG. 28, respectively.

Since the description of the first region I of FIG. 28 is substantially the same as that described with reference to FIGS. 1 to 6 and FIGS. 10 to 27, the following description will focus on the third region III of FIG. 28.

Referring to FIGS. 28 to 31, the semiconductor device according to some embodiments of the present disclosure may include an active pattern 310, a third gate electrode 320, and a third source/drain pattern 350.

The substrate 100 may include the first region I and the third region III. As an example, the third region III may be a region in which a PMOS is formed. As another example, the third region III may be a region in which an NMOS is formed. Hereinafter, the third region III will be described as a region in which a PMOS is formed. The third region III may be a logic region or an SRAM region, but is not limited thereto.

The active pattern 310, the third gate electrode 320, and the third source/drain pattern 350 may be disposed in the third region III. The active pattern 310 may be disposed on the substrate 100. The active pattern 310 may be elongated in a sixth direction X3. The active pattern 310 may include a lower pattern 310B and a plurality of sheet patterns 310U.

The lower pattern 310B may protrude from the substrate 100. The lower pattern 310B may be elongated in the sixth direction X3, The lower pattern 310B may be defined by a third fin trench FT3.

The plurality of sheet patterns 310U may be disposed on the upper surface of the lower pattern 310B. The plurality of sheet patterns 310U may be spaced apart from the lower pattern 310B in the fifth direction Z. The sheet patterns 310U may be spaced apart from each other in the fifth direction Z. Although it is illustrated that three sheet patterns 310U are arranged in the fifth direction Z, this is merely for simplicity of description and the present disclosure is not limited thereto.

The lower pattern 310B may be formed by etching a part of the substrate 100, or may include an epitaxial layer grown from the substrate 100. The lower pattern 310B may include silicon or germanium, each of which is an elemental semiconductor material. In addition, the lower pattern 310B may include a compound semiconductor, for example, a group IV-IV compound semiconductor or a group III-V compound semiconductor. The sheet pattern 310U may include one of silicon or germanium, each of which is an elemental semiconductor material, and a group IV-IV compound semiconductor or a group III-V compound semiconductor.

For example, the width of the sheet pattern 310U in a seventh direction Y3 may increase or decrease in proportion to the width of the lower pattern 310B in the seventh direction Y3. As an example, although it is illustrated that the widths in the seventh direction Y3 of the sheet patterns 310U stacked in the fifth direction Z are the same, this is merely for simplicity of description, and the present disclosure is not limited thereto. Unlike the illustrated example, the widths in the seventh direction Y3 of the sheet patterns 310U stacked in the fifth direction Z may decrease as the distance from the lower pattern 310B increases.

A third field insulating layer 107 may cover the sidewall of the lower pattern 310B. The third field insulating layer 107 is not disposed on the upper surface of the lower pattern 310B. Each sheet pattern 310U is disposed higher than the upper surface of the third field insulating layer 107.

A plurality of third gate structures GS3 may be disposed in the third region III of the substrate 100. The third gate structure GS3 may extend in the seventh direction Y3. The third gate structure GS3 may include a third gate electrode 320, a third gate insulating layer 330, a third gate spacer 340, and a third gate capping pattern 345.

The third gate electrode 320 may be disposed on the lower pattern 310B. The third gate electrode 320 may cross the lower pattern 310B. The third gate electrode 320 may cover the sheet pattern 310U.

The third gate insulating layer 330 may extend along the upper surface of the third field insulating layer 107 and the upper surface of the lower pattern 310B. The third gate insulating layer 330 may surround the sheet pattern 310U. The third gate insulating layer 330 may be disposed along the circumference of the sheet pattern 310U.

An intergate structure GS_INT may be disposed between the sheet patterns 310U and between the lower pattern 310B and the sheet pattern 310U. The intergate structure GS_INT may include the third gate electrode 320 and the third gate insulating layer 330 disposed between the adjacent sheet patterns 310U and between the lower pattern 310B and the sheet pattern 310U.

The third gate spacer 340 may be disposed on the sidewall of the third gate electrode 320. The third gate spacer 340 may extend in the seventh direction Y3. For example, the third gate spacer 340 may not be disposed between the sheet patterns 310U and between the lower pattern 310B and the sheet pattern 310U.

Unlike the illustrated example, the third gate spacer 340 may be disposed between the sheet patterns 310U and between the lower pattern 310B and the sheet pattern 310U.

The third gate capping pattern 345 may be disposed on the upper surface of the third gate electrode 320 and the upper surface of the third gate spacer 340.

A material included in the third gate electrode 320 is substantially the same as that of the first gate electrode 120. A material included in the third gate insulating layer 330 is substantially the same as that of the first gate insulating layer 130. A material included in the third gate spacer 340 is substantially the same as that of the first gate spacer 140. A material included in the third gate capping pattern 345 is substantially the same as that of the first gate capping pattern 145.

The third source/drain pattern 350 may be disposed on the lower pattern 310B. The third source/drain pattern 350 may be connected to the lower pattern 310B. The third source/drain pattern 350 may be connected to the sheet pattern 310U.

The third source/drain pattern 350 may include a second lower epitaxial region 351 and a second upper epitaxial region 352. Each of the second lower epitaxial region 351 and the second upper epitaxial region 352 may include silicon-germanium.

A third sealing insulating pattern 360 may extend along at least a part of an outer sidewall 350SW of the third source/drain pattern 350, the upper surface of the third field insulating layer 107, and the sidewall of the third gate structure GS3. The outer sidewall 350SW of the third source/drain pattern 250 may include a lower sidewall 350SW1 and an upper sidewall 350SW2. A material included in the third sealing insulating pattern 360 is substantially the same as that of the first sealing insulating pattern 160.

A third source/drain contact 370 may be disposed above the first source/drain pattern 350. The third source/drain contact 370 is connected to the third source/drain pattern 350. The third source/drain contact 370 may be disposed in the first interlayer insulating layer 191. A third silicide layer 355 may be disposed between the third source/drain contact 370 and the third source/drain pattern 350.

A second gate contact 375 may be disposed on the third gate electrode 320. The second gate contact 375 is connected to the third gate electrode 320. The second gate contact 375 may be disposed in the third gate capping pattern 345.

In concluding the detailed description, those skilled in the art will appreciate that many variations and modifications may be made to the disclosed embodiments without substantially departing from the scope of the present disclosure. Therefore, the disclosed embodiments are used in a descriptive sense and not for purposes of limitation.

What is claimed is:

1. A semiconductor device, comprising:
    a plurality of fin-shaped patterns spaced apart from each other in a first direction and extending in a second direction on a substrate;
    a field insulating layer covering sidewalls of the plurality of fin-shaped patterns and disposed between the plurality of fin-shaped patterns;
    a source/drain pattern connected to the plurality of fin-shaped patterns on the field insulating layer, the source/drain pattern comprising an upper epitaxial region and a lower epitaxial region including bottom surfaces respectively connected to the plurality of fin-shaped patterns, and at least one connection surface connecting the bottom surfaces to each other; and
    a sealing insulating pattern extending along the connection surface of the source/drain pattern and an upper surface of the field insulating layer,
    wherein the upper epitaxial region and the lower epitaxial region of the source/drain pattern comprise a first silicon-germanium pattern and a second silicon-germanium pattern, respectively,
    wherein the first silicon-germanium pattern and the second silicon-germanium pattern are doped with a p-type impurity, and
    wherein a germanium fraction of the first silicon-germanium pattern is different from a germanium fraction of the second silicon-germanium pattern.

2. The semiconductor device of claim 1, wherein the sealing insulating pattern comprises an air gap.

3. The semiconductor device of claim 1, wherein the sealing insulating pattern does not comprise an air gap.

4. The semiconductor device of claim 1, wherein the sealing insulating pattern comprises a first sealing insulating pattern and a second sealing insulating pattern,
    the first sealing insulating pattern comprises an air gap, and the second sealing insulating pattern does not comprise an air gap.

5. The semiconductor device of claim 1, further comprising an insertion sealing pattern disposed between the sealing insulating pattern and the field insulating layer.

6. The semiconductor device of claim 5, wherein the sealing insulating pattern comprises a first sealing insulating pattern and a second sealing insulating pattern,
    the field insulating layer comprises a first region and a second region,
    the insertion sealing pattern is disposed between the first region of the field insulating layer and the first sealing insulating pattern, and is not disposed between the second region of the field insulating layer and the second sealing insulating pattern.

7. The semiconductor device of claim 5, wherein the insertion sealing pattern extends entirely along a boundary surface between the field insulating layer and the sealing insulating pattern.

8. The semiconductor device of claim 5, wherein the insertion sealing pattern comprises a first portion and a second portion disposed on the upper surface of the field insulating layer, and the first portion of the insertion sealing pattern and the second portion of the insertion sealing pattern are spaced apart from each other in the first direction.

9. The semiconductor device of claim 5, wherein the sealing insulating pattern comprises a first sealing insulating pattern, a second sealing insulating pattern, and a third sealing insulating pattern,
    the field insulating layer comprises a first region, a second region, and a third region,
    the insertion sealing pattern comprises a first insertion sealing pattern between the first region of the field insulating layer and the first sealing insulating pattern, and a second insertion sealing pattern between the second region of the field insulating layer and the second sealing insulating pattern,
    the first insertion sealing pattern extends entirely along a boundary surface between the first region of the field insulating layer and the first sealing insulating pattern,
    the second insertion sealing pattern is separated into two parts on an upper surface of the second region of the field insulating layer, and
    the insertion sealing pattern is not disposed between the third region of the field insulating layer and the third sealing insulating pattern.

10. The semiconductor device of claim 1, wherein the field insulating layer comprises first, second and third regions,
    the second region of the field insulating layer is disposed between the first region of the field insulating layer and the third region of the field insulating layer, and
    a height of an upper surface of the second region of the field insulating layer is different from a height of an upper surface of the third region of the field insulating layer.

11. The semiconductor device of claim 10, wherein a height of an upper surface of the first region of the field insulating layer is equal to the height of the upper surface of the second region of the field insulating layer.

12. The semiconductor device of claim 10, wherein the height of the upper surface of the second region of the field insulating layer is greater than a height of an upper surface of the first region of the field insulating layer, and is smaller than the height of the upper surface of the third region of the field insulating layer.

13. The semiconductor device of claim 10, wherein a height of an upper surface of the first region of the field insulating layer and the height of the upper surface of the third region of the field insulating layer are smaller than the height of the upper surface of the second region of the field insulating layer.

14. The semiconductor device of claim 10, wherein a height of an upper surface of the first region of the field insulating layer and the height of the upper surface of the third region of the field insulating layer are greater than the height of the upper surface of the second region of the field insulating layer.

15. A semiconductor device, comprising:
    a plurality of fin-shaped patterns extending in a first direction on a substrate;
    a field insulating layer covering sidewalls of the plurality of fin-shaped patterns and disposed between the fin-shaped patterns;
    a plurality of gate structures extending in a second direction on the field insulating layer, each of the gate structures comprising a gate spacer;
    a source/drain pattern in contact with the gate spacer between the gate structures adjacent to each other in the first direction and connected to the plurality of fin-shaped patterns, the source/drain pattern comprising bottom surfaces respectively connected to the fin-shaped patterns, and at least one connection surface connecting the bottom surfaces to each other; and
a sealing insulating pattern extending along an upper surface of the field insulating layer and a sidewall of the gate structure,
wherein the source/drain pattern comprises first portions and second portions, the second portion of the source/drain pattern being disposed between the first portions of the source/drain pattern,
in the first portion of the source/drain pattern, the source/drain pattern has a first width in the first direction, and
in the second portion of the source/drain pattern, a width of the source/drain pattern in the first direction decreases from the first width to a second width and then increases to the first width.

16. The semiconductor device of claim 15, wherein the sealing insulating pattern extends along the connection surface of the source/drain pattern.

17. The semiconductor device of claim 15, wherein the source/drain pattern comprises a silicon-gennanium pattern doped with a p-type impurity.

18. A semiconductor device, comprising:
a plurality of first fin-shaped patterns disposed in a first region of a substrate and spaced apart from each other in a first direction;
a plurality of second fin-shaped patterns disposed in a second region of the substrate and spaced apart from each other in a second direction;
a first field insulating layer covering sidewalls of the plurality of first fin-shaped patterns and disposed between the first fin-shaped patterns;
a second field insulating layer covering sidewalls of the plurality of second fin-shaped patterns and disposed between the second fin-shaped patterns;
a first source/drain pattern connected to the plurality of first fin-shaped patterns on the first field insulating layer, the first source/drain pattern comprising first bottom surfaces respectively connected to the first fin-shaped patterns, at least one first connection surface connecting the first bottom surfaces to each other, and a first outer sidewall extending from the first bottom surface;
a second source/drain pattern connected to the plurality of second fin-shaped patterns on the second field insulating layer, the second source/drain pattern comprising second bottom surfaces respectively connected to the second fin-shaped patterns, at least one second connection surface connecting the second bottom surfaces to each other, and a second outer sidewall extending from the second bottom surface;
a first sealing insulating pattern extending along the first connection surface of the first source/drain pattern, an upper surface of the first field insulating layer, and the first outer sidewall of the first source/drain pattern; and
a second sealing insulating pattern extending along the second outer sidewall of the second source/drain pattern,
wherein the second sealing insulating pattern is not disposed on the second connection surface of the second source/drain pattern and an upper surface of the second field insulating layer.

19. The semiconductor device of claim 18, wherein the first region is a p-channel metal-oxide semiconductor (PMOS) region, and the second region is an n-channel metal-oxide semiconductor (NMOS) region.

20. The semiconductor device of claim 18, further comprising an insertion sealing pattern disposed between the first sealing insulating pattern and the first field insulating layer.

* * * * *